US009299381B2

(12) United States Patent
Nealey et al.

(10) Patent No.: US 9,299,381 B2
(45) Date of Patent: Mar. 29, 2016

(54) SOLVENT ANNEALING BLOCK COPOLYMERS ON PATTERNED SUBSTRATES

(75) Inventors: Paul F. Nealey, Madison, WI (US); Lei Wan, San Jose, CA (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 817 days.

(21) Appl. No.: 13/367,337

(22) Filed: Feb. 6, 2012

(65) Prior Publication Data
US 2012/0202017 A1    Aug. 9, 2012

Related U.S. Application Data

(60) Provisional application No. 61/440,354, filed on Feb. 7, 2011.

(51) Int. Cl.
| | |
|---|---|
| *B32B 3/10* | (2006.01) |
| *B05D 3/10* | (2006.01) |
| *B05D 3/00* | (2006.01) |
| *B05D 5/00* | (2006.01) |
| *G11B 5/82* | (2006.01) |
| *B81C 1/00* | (2006.01) |
| *B82Y 10/00* | (2011.01) |
| *G11B 5/855* | (2006.01) |

(Continued)

(52) U.S. Cl.
CPC ............ *G11B 5/82* (2013.01); *B81C 1/00031* (2013.01); *B82Y 10/00* (2013.01); *B82Y 30/00* (2013.01); *B82Y 40/00* (2013.01); *G03F 7/165* (2013.01); *G11B 5/855* (2013.01); *B81C 2201/0149* (2013.01); *Y10T 428/24802* (2015.01)

(58) Field of Classification Search
CPC ................................................ B81C 2201/0149
See application file for complete search history.

(56) References Cited

U.S. PATENT DOCUMENTS

| 3,444,732 A | 5/1969 | McKinley |
| 4,235,657 A | 11/1980 | Greenman et al. |

(Continued)

FOREIGN PATENT DOCUMENTS

| JP | 10-330494 | 12/1998 |
| JP | 2004-087531 | 3/2004 |

(Continued)

OTHER PUBLICATIONS

Nealey et al., "Square Arrays of Vertical Cylinders of PS-b-PMMA on Chemically Nanopatterned Surfaces," 2007, Macromolecules, 40, 5084-5094.*

(Continued)

*Primary Examiner* — Ian Rummel
(74) *Attorney, Agent, or Firm* — Weaver Austin Villeneuve & Sampson LLP

(57) ABSTRACT

Provided herein are block copolymer thin film structures and methods of fabrication. Aspects described herein include methods of directed self-assembly of block copolymers on patterns using solvent annealing, and the resulting thin films, structures, media or other compositions. According to various embodiments, solvent annealing is used direct the assembly of block copolymers on chemical patterns to achieve high degrees of pattern perfection, placement of features at the precision of the lithographic tool used to make the chemical pattern, improved dimensional control of features, improved line edge and line width roughness, and resolution enhancement by factors of two to four or greater.

19 Claims, 20 Drawing Sheets

(51) Int. Cl.
*B82Y 30/00* (2011.01)
*B82Y 40/00* (2011.01)
*G03F 7/16* (2006.01)

(56) References Cited

U.S. PATENT DOCUMENTS

| | | | |
|---|---|---|---|
| 5,948,470 | A | 9/1999 | Harrison et al. |
| 6,146,755 | A | 11/2000 | Guha et al. |
| 6,162,532 | A | 12/2000 | Black et al. |
| 6,565,763 | B1 | 5/2003 | Asakawa et al. |
| 6,746,825 | B2 | 6/2004 | Nealey et al. |
| 6,893,705 | B2 | 5/2005 | Thomas |
| 6,926,953 | B2 | 8/2005 | Nealey et al. |
| 7,704,432 | B2 | 4/2010 | Dumond et al. |
| 7,763,319 | B2 | 7/2010 | Cheng et al. |
| 7,901,607 | B2 | 3/2011 | Xu et al. |
| 7,959,975 | B2 | 6/2011 | Millward |
| 8,133,341 | B2 | 3/2012 | Nealey et al. |
| 8,133,534 | B2 | 3/2012 | Nealey et al. |
| 8,186,284 | B2 | 5/2012 | Nealey et al. |
| 8,287,957 | B2 | 10/2012 | Nealey et al. |
| 8,501,304 | B2 | 8/2013 | Stoykovich et al. |
| 8,618,221 | B2 | 12/2013 | Nealey et al. |
| 8,623,493 | B2 | 1/2014 | Nealey et al. |
| 2002/0132083 | A1 | 9/2002 | Weller et al. |
| 2003/0091752 | A1 | 5/2003 | Nealey et al. |
| 2003/0091865 | A1 | 5/2003 | Chen et al. |
| 2004/0091748 | A1 | 5/2004 | Kamata et al. |
| 2004/0143063 | A1 | 7/2004 | Chen et al. |
| 2004/0174257 | A1 | 9/2004 | Kuhns et al. |
| 2006/0134556 | A1 | 6/2006 | Nealey et al. |
| 2007/0092721 | A1 | 4/2007 | Kishimoto |
| 2007/0095469 | A1 | 5/2007 | Burdinski |
| 2008/0075978 | A1 | 3/2008 | Weller et al. |
| 2008/0233435 | A1 | 9/2008 | Hasegawa et al. |
| 2008/0257187 | A1 | 10/2008 | Millward |
| 2008/0299353 | A1 | 12/2008 | Stoykovich et al. |
| 2009/0087653 | A1 | 4/2009 | Nealey et al. |
| 2009/0087664 | A1 | 4/2009 | Nealey et al. |
| 2009/0196488 | A1 | 8/2009 | Nealey et al. |
| 2009/0260750 | A1 | 10/2009 | Nealey et al. |
| 2010/0255268 | A1 | 10/2010 | Choi et al. |
| 2010/0316849 | A1 | 12/2010 | Millward et al. |
| 2012/0164392 | A1 | 6/2012 | Stoykovich et al. |
| 2012/0189824 | A1 | 7/2012 | Nealey et al. |
| 2012/0202017 | A1 | 8/2012 | Nealey et al. |
| 2013/0189504 | A1 | 7/2013 | Nealey et al. |
| 2013/0230705 | A1 | 9/2013 | Nealey et al. |
| 2014/0010990 | A1 | 1/2014 | Nealey et al. |
| 2014/0065379 | A1 | 3/2014 | Nealey et al. |
| 2014/0087142 | A1 | 3/2014 | Nealey et al. |

FOREIGN PATENT DOCUMENTS

| | | |
|---|---|---|
| JP | 2004/099667 | 4/2004 |
| JP | 2005-502916 | 1/2005 |
| JP | 2005-502917 | 1/2005 |
| JP | 2007/138052 | 5/2007 |
| JP | 2007/313568 | 6/2007 |
| JP | 2007/111215 A | 12/2007 |
| JP | 2007/125699 | 12/2009 |
| JP | 2011-080379 | 4/2011 |
| WO | 03/023517 | 3/2003 |
| WO | 2006/112887 | 6/2006 |
| WO | 2009/146068 | 12/2009 |
| WO | 2009/146086 | 12/2009 |

OTHER PUBLICATIONS

"Self-assembly of block copolymer thin films," Albert et al., Materials Today, Jun. 2010, vol. 13, No. 6, pg. 24-33.*
U.S. Appl. No. 11/545,060, filed Oct. 5, 2006, Nealey et al.
U.S. Appl. No. 11/580,694, filed Oct. 12, 2007, Nealey et al.
U.S. Appl. No. 11/879,578, filed Feb. 17, 2007, Nealey et al.
U.S. Office Action mailed Jun. 25, 2010, from U.S. Appl. No. 11/286,260.
Remarks made in Office Action Response filed Sep. 27, 2010 for U.S. Appl. No. 11/286,260.
Asakawa et al. (2002) Nanopatterning with Microdomains of Block Copolymers using Reactive-Ion Etching Selectivity, *Jpn. J. Appl. Phys.* vol. 41 (2002) pp. 6112-6118.
Bates et al. (1990) Block Copolymer Thermodynamics: Theory and Experiment, *Annu.Rev.Phys. Chem.*, 1990, 41: pp. 525-557.
Bates et al. (1995) Isotropic Lifshitz Behavior in Block Copolymer-Homopolymer Blends, *Phy Rev Ltrs*, vol. 75, No. 24, Dec. 11, 1995.
Bates et al. (1997) Polymeric Bicontinuous Microemulsions, *Phy Rev Ltrs*, vol. 69, No. 5, Aug. 4, 1997.
Bates, et al., "Block Copolymers—Designer Soft Materials," *Physics Today*, Feb. 1999, vol. 52, No. 2, pp. 32-38.
Berreman et al. (1990) Use of trilevel resists for high-resolution soft-x-ray projection lithography, *Appl. Phys Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Black, C.T., et al, "Polymer Self Assembly in Semiconductor Microelectronics," IBM Journal of Research and Development, *International Business Machines Corporation*, New York, vol. 51, No. 5, Sep. 1, 2007, XP007905680, pp. 605-633.
Bohbot-Raviv, et al., "Discovering New Ordered Phases of Block Copolymers," *The American Physical Society*, vol. 85, No. 16, Oct. 16, 2000, 4 pages.
Boltau et al. (1998) Surface-induced structure formation of polymer blends on patterned substrates, *Nature*, vol. 391, Feb. 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al. (2000) T-Junction Grain Boundaries in Block Copolymer-Homopolymer Blends, *Macromolecules*, vol. 33, pp. 8739-8745.
Campbell et al. (2000) Fabrication of photonic crystals for the visible spectrum by holographic lithography, *Nature*, vol. 404, Mar. 2, 2000, p. 53.
Cardinale et al. (1999) Demonstration of pattern transfer into sub-100 nm polysilicon line/space features patterned with extreme ultraviolet lithography, *J. Va. Sci. Technol. B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer fiilms on chemically patterned substrates, *Journal of Chemical Physics*, Apr. 22, 1998, vol. 108, No. 16, p. 6897.
Cheng et al (2001) Formation of a Cobalt Magnetic Dot Array viz Block Copolymer Lithography, *Adv Mater 2001*, 13, No. 15 Aug. 3, 2001, p. 1174-1178.
Cheng et al. (2002) Fabrication of nanostructures with long-range order using block copolymer lithography, *Applied Physics Letters*, vol. 81, No. 19, Nov. 4, 2002, p. 3657-3659.
Cheng et al. (2003) Templated Self-Assembly of Block Copolymers: Effect of Substrate Topography, *Advanced Materials* 2003, vol. 15, No. 19, Oct. 2, pp. 1599-1602.
Corvazier et al. (2001) Lamellar phases and microemulsions in model ternary blends containing amphiphilic block copolymers, *The Royal Society of Chemistry*, J. Mater. Chem, 2001, 11, pp. 2864-2874.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, *Macromolecules*, vol. 26, pp. 1582-1589.
Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.

(56) References Cited

OTHER PUBLICATIONS

Daoulas et al. (2006) Fabrication of Complex Three-Dimensional Nanostructures from Self-Assembling Block Copolymer Materials on Two-Dimensional Chemically Patterned Templates with Mismatched Symmetry, *Physical Review Letters*, Jan. 27, 2006, PRL 96, pp. 036104-1-036104-4.
Daoulas et al. (2006) Morphology of multi-component polymer systems: single chain in mean field simulation studies, The Royal Society of Chemistry, *Soft Matter*, 2006, vol. 2, pp. 573-583.
Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.
Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.
Detcheverry, et al., Monte Carlo Simulation of Coarse Grain Polymeric Systems, *The American Physical Society*, May 15, 2009, PRL 102(19) 197801(4), pp. 197801-1-197801-4.
Detcheverry, et al., "Theoretically Informed Coarse Grain Simulations of Block Copolymer Melts: Method and Applications," Soft Matter 5 (24), 2008, 4868-4865.
Detcheverry, et al., "Stimulations of Theoretically Informed Course Grain Models of Polymeric Systems," Faraday Discussions, vol. 144, (2010) 111-125 (total 17 pages).
Detcheverry, et al., Monte Carlo Simulations of a Course Grain Model for Block Copolymers and Nanocomposites, published Jun. 11, 2008, vol. 41, pp. 4989-5001.
Düchs et al. (2003) Fluctuation Effects in Ternary AB + A + B Polymeric Emulsions, *Macromolecules* V36, pp. 9237-9248.
Düchs et al. (2004) Formation and structure of the microemulsion phase in two-dimensional ternary AB+A+B Polymeric emulsions, *Jnl of Chem Phy*, vol. 121, No. 6, Aug. 8, 2004, p. 2798.
Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-344.
Edwards et al. (2004) Precise Control over Molecular Dimensions of Block-Copolymer Domains Using the Interfacial Energy of Chemically Nanopatterned Substrates, *Advanced Materials*, 2004, vol. 16, No. 15, Aug. 4, pp. 1315-1319.
Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.
Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.
Edwards, et al., "Mechanism and Kinetics of Ordering in Diblock Copolyer Thin Films on Chemically Nanopatterned Substrates," *Journal of Polymer Science*: Part B, Polymer Physics, 2005, vol. 43, pp. 3444-3459.
Ekinci, et al., "20 nm Line/Space Patterns in HSQ Fabricated by EUV Interference Lithography," Photon Lithography, MNE 2006 Micro- and Nano- Engineering, 2 pages.
Fasolka et al. (2000) Morphology of Ultrathin Supported Diblock Copolymer Films: Theory and Experiment, *Macromolecules* vol. 33, pp. 5702-5712.
Floudas et al. (1997) Microphase separation in block copolymer/homopolymer blends: Theory and experiment, *J. Chem. Phys.* 106 (8), Fe. 22, 1997, p. 3318.
Fukukawa et al. (2005) Synthesis and Characterization of Silicon-Containing Block Copolymers from Nitroside-Mediated Living Free Radical Polymerization, *Macromolecules* vol. 38, pp. 263-270.
Galatsis, K., et al., Patterning and Templating for Nanoelectronics., *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.
Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.
Helfand et al. (1972) Theory of the Interface between Immiscible Polymers, II, *Journal of Chemical Physics*, vol. 56, No. 7, Apr. 1, 1972, pp. 3592-3601.
Hillmyer et al. (1991) Model Bicontinuous Microemulsions in Ternary Homopolymer/Block Copolymer Blends, *J. Phy. Chem.* B 1999, 103, pp. 4814-4824.
Hirai, et al., "One-Step Direct-Patterning Template Utilizing Self-Assembly of POSS-Containing Block Copolymers," *Adv. Mater.*, 2009, vol. 21, pp. 4334-4338.
Hong, A., et al., "Metal Nanodot Memory by Self-Assembled Block Copolymer Lift-Off," *American Chemical Society*, Nano Left 2010, vol. 10, pp. 224-229.
Huang et al. (1991) Modeling Copolymer Adsorption on Laterally Heterogeneous Surfaces, *Physical Review Letters*, Feb. 4, 1991, vol. 66, No. 5, p. 620.
In, et al., Side-Chain-Grafted Random Copolymer Brushes as Neutral Surfaces for Controlling the Orientation of Block Copolymer Microdomains in Thin Films, *American Chemical Society*, Langmuir, published Aug. 1, 2006, vol. 22, pp. 7855-7860.
Jeong et al. (2002) Asymmetric Block Copolymers with Homopolymers: Routes to Multiple Length Scale nanostructures, *Adv. Mater*. 2002.,14, No. 4, Feb. 19, 2002, p. 274.
Jeong et al. (2003) Precise Control of Nanopore Size in Thin Film Using Mixtures of Asymmetric Block Copolymer and Homopolymer, Macromolecules 2003, 36, pp. 10126-10129.
Ji, et al., "Generalization of the Use of Random Copolymers to Control the Wetting Behavior of Block Copolymer Films," American Chemical Society, published Nov. 11, 2008, vol. 41, pp. 9098-9103.
Ji, et al., "Preparation of Neutral Wetting Brushes for Block Copolymer Films from Homopolymer Blends," Advanced Materials, 2008 vol. 20, pp. 3054-3060.
Ji, Shengxiang, et al., "Molecular Transfer Printing Using Block Copolymers," *ACS Nano* vol. 4, No. 2, 2010, pp. 599-609.
Kang, et al., "Control of the Critical Dimensions and Line Edge Roughness With Pre-Organized Block Copolymer Pixelated photoresists," *J. Vac. Sci. Technol*. vol. 27, No. 6, Nov./Dec. 2009, pp. 2993-2997.
Kang, et al., "Hierarchical Assembly of Nanoparticle Superstructures from Block Copolymer-Nanoparticle Composites," published Apr. 9, 2008, vol. 100(4), pp. 148303-1-148303-4.
Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol*., vol. 26, No. 5, Nov./Dec. 2008, pp. 2495-2499.
Kim et al. (2000) Chemical Modification of Self-Assembled Monolayers by Exposure to Soft X-rays in *Air, J. Phys. Chem.*, vol. 104, No. 31, 2000, pp. 7403-7410.
Kim et al. (2003) Epitaxial self-assembly of block copolymers on lithographically defined nanopatterned substrates, *Nature*, vol. 424, Jul. 24, 2003, *Nature* Publishing Group, pp. 411-414.
Kim, et al., "Defect Structure in Thin Films of a Lamellar Block Copolymer Self-Assemble on Neutral Homogeneous and Chemically Nanopatterned Surfaces," American Chemical Society, *Macromolecules*, published Jul. 13, 2006, vol. 39, 5466-5470.
Kim, et al., "Synthesis of Photacid Generator-Containing Patternable Diblock Copolymers by Reversible Addition—Fragmentation Transfer Polmerization," Chemistry of Materials, *American Chemical Society*, Jul. 6, 2009, pp. 3030-3032.
Krishnan et al. (2001) Shear-Induced Nano-Macro Structural Transition in a Polymeric Bicontinuous Microemulsion, *Phy Rev Ltrs*, vol. 87, No. 9, Aug. 27, 2001, p. 098301-1.
La, et al., "Directed Assembly of Cylinder-Forming Block Copolymer Films and Thermochemically Induced Cylinder to Sphere Tran-

(56) References Cited

OTHER PUBLICATIONS sition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Li et al. (2000) Dense arrays of ordered GaAs nanostructures by selective area growth on substrates patterned by block copolymer lithography, *Applied Physics Letters*, vol. 76, No. 13, Mar. 27, 2000, pp. 1689-1691.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, 1997, vol. 275, pp. 1458-1460.

Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and bicontinouous microemulsion phases, Faraday Discuss.,1999, 112, pp. 335-350.

Morkved et al. (2001) Static and Dynamic Scattering from Ternary Polymer Blends: Bicontinuous Microemulsions, Lifshitz lines, and amphiphilicity, *Jnl of Chem Phy*, V.114, No. 16, Apr. 22, 2001, p. 7247.

Morin, et al., "Assembly of Nanocrystal Arrays by Block-Copolymer-Directed Nucleation," *Angew. Chem. Inc.*, Ed. 2009, vol. 48, pp. 2135-2139.

Mortensen et al. (2000) Ternary mixture of homopolymer blend and diblock copolymer studied near the Lifshitz composition by small-angle neutron scattering, *J. Appl. Cryst.*, 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans.on Magnetics*, vol. 38, No. 5, Sep. 2002, p. 1949.

Nakano, et al., Single-Step Single-Molecure PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of ~$10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Park, et al., "Characterization of Cylinder-Forming Block Copolymers Directed to Assemble on Spotted Chemical Patterns," *American Chemical Society, Macromolecules*, Published Nov. 4, 2008, vol. 41, No. 23, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing a Diblock Copolymer Template," *IEEE* 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Park, et al., "Nano-Scale Selective Growth and Optical Characteristics of Quantum Dots on III-V Substrates Prepared by Diblock Copolymer Nano-Patterning," Journal of Nanophotonics, 3 (1), 031604, Jan. 30, 2009, pp. 1-12.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27 2009, vol. 131, pp. 084903-1to 084903-10.

Preliminary Examination Report dated May 30, 2007 issued in PCTUS2005/042568.

Rockford et al. (1999) Polymers on Nanoperiodic, Heterogeneous Surfaces, *Phy. Rev. Ltrs, The American Physical Society*, vol. 82, No. 12, pp. 2602-2605.

Ruiz, et al., "Density Multiplication and Improved Lithography by Directed block Copolymer Assembly," Science, vol. 321, Aug. 15, 2008, pp. 936-939.

Russell et al. (1989) Characteristics of the Surface-Induced Orientation for Symmetric Diblock PS/PMMA Copolymers, *Macromolecules*, vol. 22, pp. 4600-4606.

Schattenburg et al. (1995) Optically matched trilevel resist process for nanostructure fabrication, *J. Vac. Sci Technol. B*, 15(6), Nov./Dec. 1995, p. 3007.

Schwahn et al. (1999) Crossover from 3D Ising to Isotropic Lifshitz Critical Behavior in a Mixture of a Homopolymer Blend and Diblock Copolymer, *Phy. Rev. Ltrs, The American Physical Society*, vol. 82, No. 25, Jun. 21, 1999, p. 5056.

Schwahn et al. (2000) Thermal Composition fluctuations near the isotropic Lifshitz critical point in a ernary mixture of a homopolymer blend and diblock copolymer, *Jnl. Chem. Phy.*, vol. 112, No. 12, Mar. 22, 2000, p. 5454.

Solak, et al., "Sub-50 nm Period Patterns With EUV Interference Lithography," *Microelectronic Engineering* 67-68 (2003) 56-62.

(56) References Cited

OTHER PUBLICATIONS

Solak, Harun H. (2006) Nanolithography with coherent extreme ultraviolet light, *Jnl. of Physics D: App. Phys*,39 (2006) R171-R188.
Son, et al., "Placement Control of Nanomaterial Arrays on the Surface-Reconstructed Block Copolymer Thin Films," *ACSNano*, vol. 3, No. 12, 2009, pp. 3927-3934.
Son, et al., "Surfactant-Assisted Orientation of Thin Diblock Copolyer films," *Advanced Materials*, 2008, vol. 20, pp. 3643-3648.
Stoykovich et al. (2005) Directed Assembly of Block Copolymer Blends into Nonregular Device-Oriented Structures, *Science*, vol. 308, No. 5727, Jun. 3, 2005, www.sciencemag.org, pp. 1442-1446.
Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).
Stoykovich, M.P., et al, "Block Copolymers and Conventional Lithography," *Materials Today*, Elsevier Science, Kidlington, GB, vol. 9, No. 9, Sep. 1, 2006, pp. 20-29.
Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.
Stoykovich, Mark P., et al., "Methods and Compositions for Forming Patterns With Isolated or Discrete Features Using Block Copolymer Materials," U.S. Appl. No. 11/879,758, filed Jul. 17, 2007.
Stuen, et al., In situ Characterization of Block Copolymer Ordering on Chemically Nanopatterned Surfaces by time-resolved small angle X-ray Scattering, *J. Vac. Sci. Technol*. vol. 26(6), published Dec. 1, 2008, pp. 2504-2508.
Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.
Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.
Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.
Teubner et al. (1987) Origin of the Scattering Peak in Microemulsions, *J. Chem. Phys*., 87(5), Sep. 1, 1997, p. 3195.
Thurn-Albrecht et al. (2000) Nanoscopic Templates from Oriented Block Copolymer Films, Communications, *Advanced Materials*, vol. 12, No. 11, pp. 787-791.
Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.
Ting, et al., "Plasma Etch Removal of Poly (methyl methacrylate) in Block Copolymer Lithography," *J. Vac. Sci. Technol*., vol. 26(5), Sep./Oct. 2008, pp. 1684-1689.
Torikai et al. (1997) Lamellar Domain Spacings of Diblock Copolymer/Homopolymer Blends and Conformations of Block Chains in Their Microdomains, *Macromolecules*, 30, pp. 5698-5703.
Urbas et al. (2000) Tunable Block Copolymer/Homopolymer Photonic Crystals, *Advanced Materials*, vol. 12, No. 11 p. 812.
Urbas et al. (2002) Bicontinuous Cubic Block Copolymer Photonic Crystals, *Advanced Materials*, vol. 14, No. 24, Dec. 17, 2002, p. 1850.
Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.
Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.
Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.
Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.
Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.
Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.
Wang, et al., Monte Carlo Simulations of Diblock Copolymer Thin Films Confined Between two Homogeneous Surfaces, Journal of Chemical Physics, Jan. 1, 2000, 112(1): 450-464.
Welander, et al., "Impact of Trench Width Roughness on the Graphoepitaxial Assembly of Block Copolymers," *J. Vac Sci. Technol*., vol. 26(6), Nov./Dec. 2008, pp. 2484-2489.
Welander, et al., "Rapid Directed Assembly of Block Copolymer Films at Elevated Temperatures," *American Chemical Society*, Macromolecules, vol. 41, Published Apr. 1, 2008, pp. 2759-2761.
Whitesides et al. (1991) Molecular self-Assembly and Nanochemistry: A Chemical Strategy for the Synthesis of Nanostructures, Articles, *Science* vol. 254, p. 1312, Nov. 29, 1991.
Whitesides et al. (2002) Self-Assembly at All Scales, *Science, AAAS*, 295, p. 2418.
Xiao, et al., "Graphoepitaxy of Cylinder-forming Block Copolymers for Use as Templates to Pattern Magnetic Metal Dot Arrays," Institute of Physics Publishing, *Nanotechnology*, vol. 16, No. 7, 2005, pp. S324-S329.
Xu et al. (2001) The Influence of molecular weight on nanoporous polymer films, *Polymer*, 42 (2001) pp. 9091-9095; www.elsevier.com/locate/polymer.
Yang et al. (2000) Guided Self-Assembly of Symmetric Diblock Copolymer Films on Chemically Nanopatterned Substrates, *Macromolecules 2000*, 33, pp. 9575-9582.
Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.
Yang, et al., "Patterning of Self-Assembled Monolayers with Lateral Dimensions of 0.15 um Using Advanced Lithography," *J. Vac Sci. Technol*., vol. 17(6), Nov./Dec. 1999, pp. 3203-3207.
Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.
Nealey, Paul Franklin, et al., "Density Multiplication and Improved Lithography by Directed Block Copolymer Assembly," U.S. Appl. No. 12/329,484, filed Dec. 5, 2008.
International Search Report and Written Opinion of the International Searching Authority mailed Aug. 24, 2009, Application No. PCT/US 2008/085742, 14 pages.
Nealey, Paul Franklin, et al., "Molecular Transfer Printing Using Block Copolymers," U.S. Appl. No. 12/416,816, filed Apr. 1, 2009.
International Search Report and Written Opinion of the International Searching Authority mailed Dec. 16, 2009, Application No. PCT/US2009/039208.
Nealey, Paul Franklin, et al., "Methods and Compositions for Forming a Periodic Patterned Copolymer Films," U.S. Appl. No. 11/286,260, filed Nov. 22, 2005.
U.S. Office Action mailed Jul. 31, 2009, from U.S. Appl. No. 11/286,260.
U.S. Office Action mailed Jan. 25, 2010, from U.S. Appl. No. 11/286,260.
International Search Report and Written Opinion dated May 2, 2007 issued in WO2006112887.

(56) References Cited

OTHER PUBLICATIONS

Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.
U.S. Office Action mailed Apr. 3, 2009, from U.S. Appl. No. 11/545,060.
U.S. Office Action mailed Nov. 30, 2009, from U.S. Appl. No. 11/545,060.
Nealey, Paul Franklin, "Directed Assembly of Triblock Copolymers," U.S. Appl. No. 11/580,694, filed Oct. 12, 2006.
U.S. Office Action mailed Dec. 2, 2009, from U.S. Appl. No. 11/580,694.
U.S. Office Action mailed Jul. 23, 2009, from U.S. Appl. No. 11/879,758.
U.S. Final Office Action mailed Mar. 8, 2010, from U.S. Appl. No. 11/879,758.
U.S. Office Action mailed Jul. 12, 2010, from U.S. Appl. No. 11/545,060.
U.S. Final Office Action mailed Jun. 10, 2010, from U.S. Appl. No. 11/580,694.
Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.
Morkved et al., "Local control of microdomain orientation in diblock copolymer thin films with electric fields," Science, 273 (5277): 931-933 Aug 16, 1996, pp. 931-933.
Kim, S.H., et al., "Highly oriented and ordered arrays from block copolymers via solvent evaporation," *Advanced Materials*, Feb. 3, 2004, 16 (3), pp. 226-231.
Fasolka, MJ, et al., Block copolymer thin films: Physics and applications, Annual Review of Materials Research, 2001, 31, pp. 323-355.
Tanaka, H, et al., "Ordered Structure in Mixtures of a Block Copolymer and Homopolymers . 1. Solubilizatian of Low-Molecular-Weight Homopolymers," Macromolecules, 24 (1), Jan. 7, 1991, pp. 240-251.
Hamley, et al., Nanostructure fabrication using block copolymers, *Nanotechnology*, Oct. 2003, 14 (10), pp. R39-R54.
Segalman, RA, et al., "Graphoepitaxy of spherical domain block copolymer films," Advanced Materials, Aug. 3, 2001, 13 (15) pp. 1152-1155.
U.S. Office Action mailed Dec. 27, 2010, from U.S. Appl. No. 11/545,060.
Office Action mailed Oct. 7, 2010 for U.S. Appl. No. 12/416,816.
U.S. Final Office Action mailed Dec. 13, 2010, from U.S. Appl. No. 11/286,260.
U.S. Office Action mailed Mar. 15, 2011, from U.S. Appl. No. 11/545,060.
U.S. Office Action mailed Dec. 17, 2010, from U.S. Appl. No. 11/545,060.
Office Action mailed Apr. 20, 2011 for U.S. Appl. No. 12/416,816.
Office Action mailed Apr. 21, 2011 for U.S. Appl. No. 12/329,484.
Watanabe, et al., "Smart Block Copolymer Masks With Molecule-Transport Channels for Total Wet Nanopatterning," J. Mater. Chem, 2008, vol. 18, 5482-5491.
Final Office action mailed Jul. 8, 2011, U.S. Appl. No. 11/879,758.
Final Office Action mailed Oct. 14, 2011 for U.S. Appl. No. 12/329,484.
Office Action mailed Aug. 31, 2011 for U.S. Appl. No. 12/416,816.
Final Office Action mailed Sep. 1, 2011, from U.S. Appl. No. 11/545,060.
Supplemental EuropeanSearch Report mailed Oct. 26, 2011, from U.S. Appl. No. 05/857,837.8.
Notice of Allowance mailed Nov. 2, 2011 for U.S. Appl. No. 12/416,816.
Allowed Claims as of Nov. 2, 2011 for U.S Appl. No. 12/416,816.
Notice of Allowance mailed Nov. 4, 2011 for U.S Appl. No. 11/879,758.
Allowed Claims as of Nov. 4, 2011 for U.S Appl. No. 11/879,758.
Notice of Allowance mailed Dec. 21, 2011, for U.S Appl. No. 11/545,060.
Allowed Claims as of Dec. 21, 2011, for U.S Appl. No. 11/545,060.
Stoykovich, et al., "Methods and Compositions for Forming Patterns With Isolated or Discrete Features Using Block Copolymer Materials," filed Feb. 3, 2012, U.S Appl. No. 13/366,134.
Nealey, Paul Franklin, "Fabrication of Complex Three-Dimensional Structures Based on Directed Assembly of Self-Assembling Materials on Activated Two-Dimensional Templates," U.S. Appl. No. 13/436,341, filed Mar. 30, 2012.
Japanese Office Action mailed Jul. 3, 2012, Application No. 2007-543480.
Nealey, Paul Franklin, "Improved Patterning in the Directed Assembly of Block Copolymers Using Triblock or Multi-Block Copolymers," U.S. Appl. No. 13/543,667, filed Jul. 6, 2012.
Office Action mailed Apr. 11, 2012 for U.S Appl. No. 12/329,484.
Office Action mailed Aug. 15, 2012 for U.S Appl. No. 13/436,341.
Facsko, et al., Formation of Ordered Nanoscale Semiconductor Dots by Ion Sputtering, Science, vol. 285, Sep. 3, 1999 pp. 1551-1553.
Kim, S., et al, "Decoupling Bulk Thermodynamics and Wetting Characteristics of Block Copolymer Thin Films," ACS Macro Lett., American Chemical Society, pp. 11-14.
Notice of Allowance mailed Jun. 7, 2012, for U.S. Appl. No. 11/286,260.
U.S. Office Action mailed Oct. 15, 2012, from U.S. Appl. No. 11/580,694.
U.S. Office Action mailed Sep. 24, 2012, from U.S. Appl. No. 13/366,134.
Final Office Action mailed Dec. 18, 2012, for U.S Appl. No. 12/329,484.
Notice of Allowance mailed Apr. 5, 2013, from U.S. Appl. No. 13/366,134.
Ho, Chih-Shing, "Precision of Digital Vision Systems," IEEE Transaction on Pattern Analysis and Machine Intelligence, vol. PAMI-5, No. 6, Nov. 1983, pp. 593-601.
Nealey, Paul Franklin, et al. "Directed Assembly of Block Copolymer Films Between a Chemically Patterned Surface and a Second Surface," U.S. Appl. No. 13/619,525, filed Sep. 14, 2012.
International Search Report and Written Opinion mailed Dec. 5, 2012.
Nealey, Paul Franklin, et al. "Directed Assembly of Block Copolymer Films Between a Chemically Patterned Surface and a Second Surface," U.S. Appl. No. 13/543,681, filed Jul. 6, 2012.
Nealey, Paul Franklin, et al. "Topcoat Surfaces for Directing the Assembly of Block Copolymer Films on Chemically Patterned Surfaces," U.S. Appl. No. 13/601,460, filed Aug. 31, 2012.
Final Office Action mailed May 31, 2013, from U.S. Appl. No. 11/580,694.
Notice of Allowance mailed Sep. 6, 2013, from U.S. Appl. No. 11/580,694.
Office Action mailed Jul. 12, 2013 for U.S Appl. No. 12/329,484.
Notice of Allowance mailed Sep. 5, 2013 for U.S Appl. No. 13/436,341.
Nealey, Paul Franklin, "Fabrication of Complex Three-Dimensional Structures Based on Directed Assembly of Self-Assembling Materials on Activated Two-Dimensional Templates," U.S. Appl. No. 14/092,551, filed Nov. 27, 2013.
Final Office Action mailed May 8, 2014 for U.S Appl. No. 12/329,484.
International Search Report and Written Opinion mailed on Nov. 26, 2013, issued in Application No. PCT /US2013/056792.
Hanley, et al., Phase Behavior of a Block Copolymer in Solvents of Varying Selectivity, *Macromolecules* Jul. 7, 2000, vol. 33, pp. 5918-5931.
Ho et al., "Solvent-Induced Microdomain Orientation in polystyrene-b-poly(L-lactide) Diblock Copolymer Thin Films for Nanopatterning," *Polymer*, vol. 46, Aug. 15, 2005, pp. 9362-9377.
Kim, et al., "High Oriented and ordered Arrays from Block Copolymers Via Solvent Evaporation," *Adv. Mater.*, vol. 16, No. 3, Feb. 3, 2004, pp. 226-231.

(56) References Cited

OTHER PUBLICATIONS

Kim, et al., "Solvent-Induced Ordering in Thin Film Diblock Copolymer/Homopolyer Mixtures," *Adv. Mater.*, vol. 16, No. 23-24, Dec. 17, 2004, pp. 2119-2123.

Kim, et al., Morphological Development in Solvent-Cast Polystyrene-Polybutadiene-Polystyrene (SBS) Triblock Copolymer Thin Films, *Macromolecules*, vol. 31, Mar. 31, 1998, pp. 2369-2577.

Lin, et al., "A Rapid Route to Arrays of Nanostructures in Thin Films," *Adv. Mater.*, vol. 14, No. 19, Oct. 2, 2002, pp. 1373-1376.

Lodge, et al., "Phase Behavior of Block Copolymers in a Neutral Solvent," *Macromolecules*, vol. 36, No. 3, Jan. 3, 2003, pp. 816-822.

Mori, et al., "Order-Disorder Transition of Polystyrene-Block-Polyisoprene Part II. Characteristic length as a function of polymer concentration, molecular weight, copolymer composition, and $\chi$ parameter," *Polymer*, vol. 42, 2001, pp. 3009-3021.

Shibayama, et al., Ordered Structure in Block Polymer Solutions. 3. Concentration Dependence of Microdomains in Nonselective Solvents, *J. Am. Chem. Soc.*, vol. 16, 1983, pp. 1427-1433.

Sidorenko, et al., "Ordered Reactive Nanomembranes/Nanotemplates from Thin Films of Block Copolymer Supramolecular Assembly," *J. Am. Chem. Soc.*, vol. 125, 2003, pp. 1221-1226.

Office Action mailed Mar. 25, 2015, issued in U.S. Appl. No. 13/619,525.

Feng, et al., "Monte Carlo Simulation of Triblock Copolymer Thin Films," *Polymer*, vol. 43, Jul. 6, 2002, pp. 5775-5790.

* cited by examiner

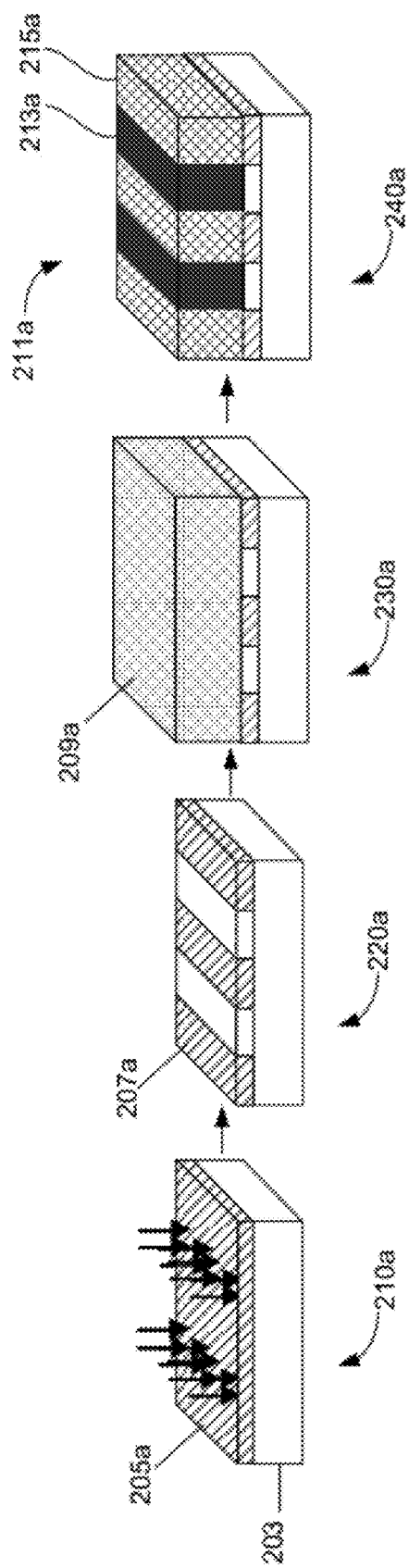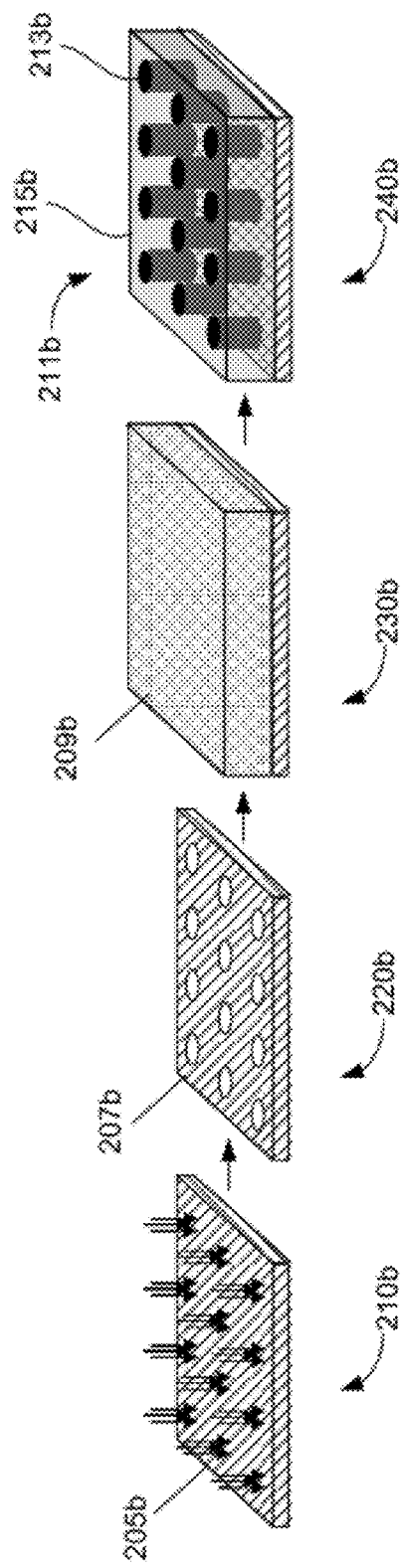
FIG. 2A
FIG. 2B

θ = 60°

θ = 90°

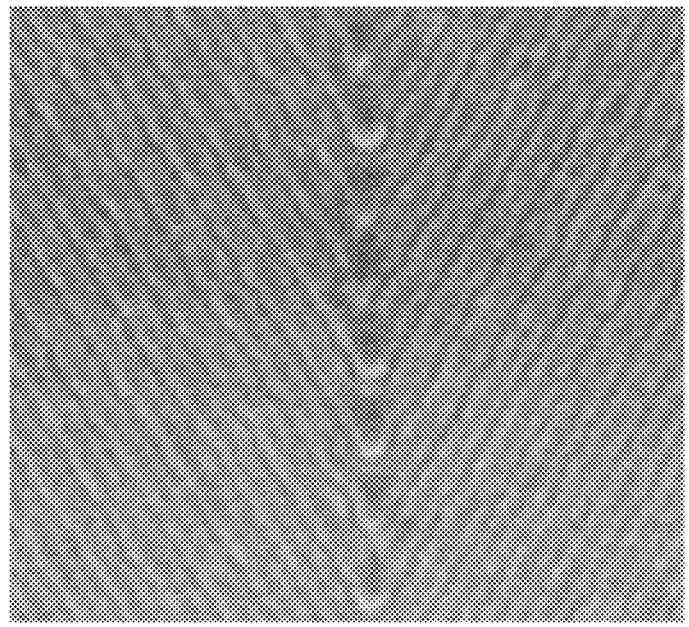
θ = 120°
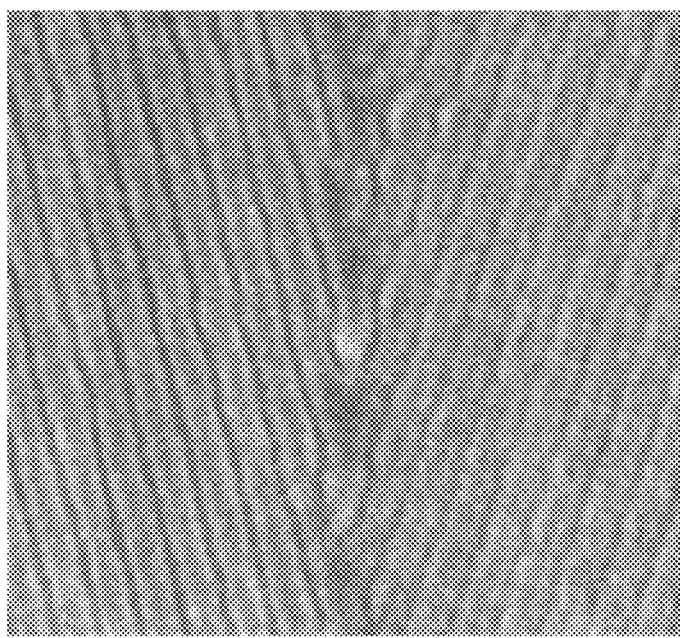
θ = 150°
*FIG. 8, cont.* ps-b-PMMA at an equivalent temperature of assembly. Solvent annealing can be performed at temperatures lower than thermal annealing. In some embodiments, solvent annealing is performed at room temperature.

SOLVENT ANNEALING BLOCK COPOLYMERS ON PATTERNED SUBSTRATES

CROSS-REFERENCE TO RELATED APPLICATION

This application claims benefit under 35 U.S.C. §119(e) to U.S. Provisional Patent Application No. 61/440,354, filed Feb. 7, 2011, titled "Solvent Annealing Block Copolymers On Patterned Substrates," which application is incorporated by reference herein in its entirety.

STATEMENT OF GOVERNMENT SUPPORT

This invention was made with government support under 0520527 awarded by the National Science Foundation. The government has certain rights in the invention.

FIELD OF THE INVENTION

The invention relates to methods of nanofabrication techniques. More specifically, the invention relates to forming nanoscale structures with block copolymers.

BACKGROUND OF THE INVENTION

Advanced nanoscale science and engineering have driven the fabrication of two-dimensional and three-dimensional structures with nanometer precision for various applications including electronics, photonics and biological engineering. Traditional patterning methods such as photolithography and electron beam lithography that have emerged from the microelectronics industry are limited in the features that can be formed as critical dimensions decrease and/or in fabrication of three-dimensional structures

SUMMARY

Provided herein are block copolymer thin film structures and methods of fabrication. Aspects described herein include methods of directed self-assembly of block copolymers on patterns using solvent annealing, and the resulting thin films, structures, media or other compositions. According to various embodiments, solvent annealing is used direct the assembly of block copolymers on chemical patterns to achieve high degrees of pattern perfection, placement of features at the precision of the lithographic tool used to make the chemical pattern, improved dimensional control of features, improved line edge and line width roughness, and resolution enhancement by factors of two to four or greater.

One aspect relates to a method including providing a substrate pattern; depositing a block copolymer material on the substrate pattern; and inducing the formation of microphase-separated domains in the block copolymer material by solvent annealing. In some embodiments, the substrate pattern has a pattern period ($L_s$) between 0.8 and 1.2 times a vitrified microdomain period of the block copolymer material in the solvent ($L_v$). In some embodiments, $L_v$ differs from the bulk period $L_o$ of the block copolymer material. The substrate pattern can also include at least one feature having an effective pattern period that differs from $L_s$, for example, a bend, a jog, or isolated spot. In some embodiments, the method can further include evaporating the solvent. Examples of solvents include methanol, acetone, carbon disulfide, dimethylformamide, toluene, and tetrahydrofuran. According to various embodiments, all or only a subset of the polymer blocks of the block copolymer material are soluble in the solvent.

The microphase-separated domains can be registered with the substrate pattern after solvent annealing. In some embodiments, they are oriented substantially perpendicular to the substrate. Also in some embodiments, the microphase-separated domains can extend through the entire thickness of the block copolymer material. In some embodiments $L_s$ is between $0.9 L_v$ and $1.1 L_v$.

In some embodiments, the interaction parameter ($\chi$) of a block copolymer in the block copolymer material is larger than that of PS-b-PMMA at an equivalent temperature of assembly. Solvent annealing can be performed at temperatures lower than thermal annealing. In some embodiments, solvent annealing is performed at room temperature.

Another aspect relates to method including providing a block copolymer film on a substrate pattern and exposing the block copolymer film on the substrate pattern to a solvent to thereby direct the assembly of the block copolymer film. The method can further include evaporating the solvent. The solvent can be evaporated after the assembly of the block copolymer film. In some embodiments, the assembled block copolymer film has smaller features than the bulk block copolymer. In some embodiments, the density of features in the assembled block copolymer film is greater than the substrate pattern density.

Another aspect relates to thin film compositions and nanoscale structures formed using the methods described herein. These and other aspects are described more fully below with reference to the drawings.

BRIEF DESCRIPTION OF THE DRAWINGS

FIGS. 2A and 2B show examples of directed assembly of lamellar and cylindrical ordered domains.

FIG. 11A shows a top down SEM image. FIG. 11B shows a cross-sectional SEM image of a 200 nm thick film.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
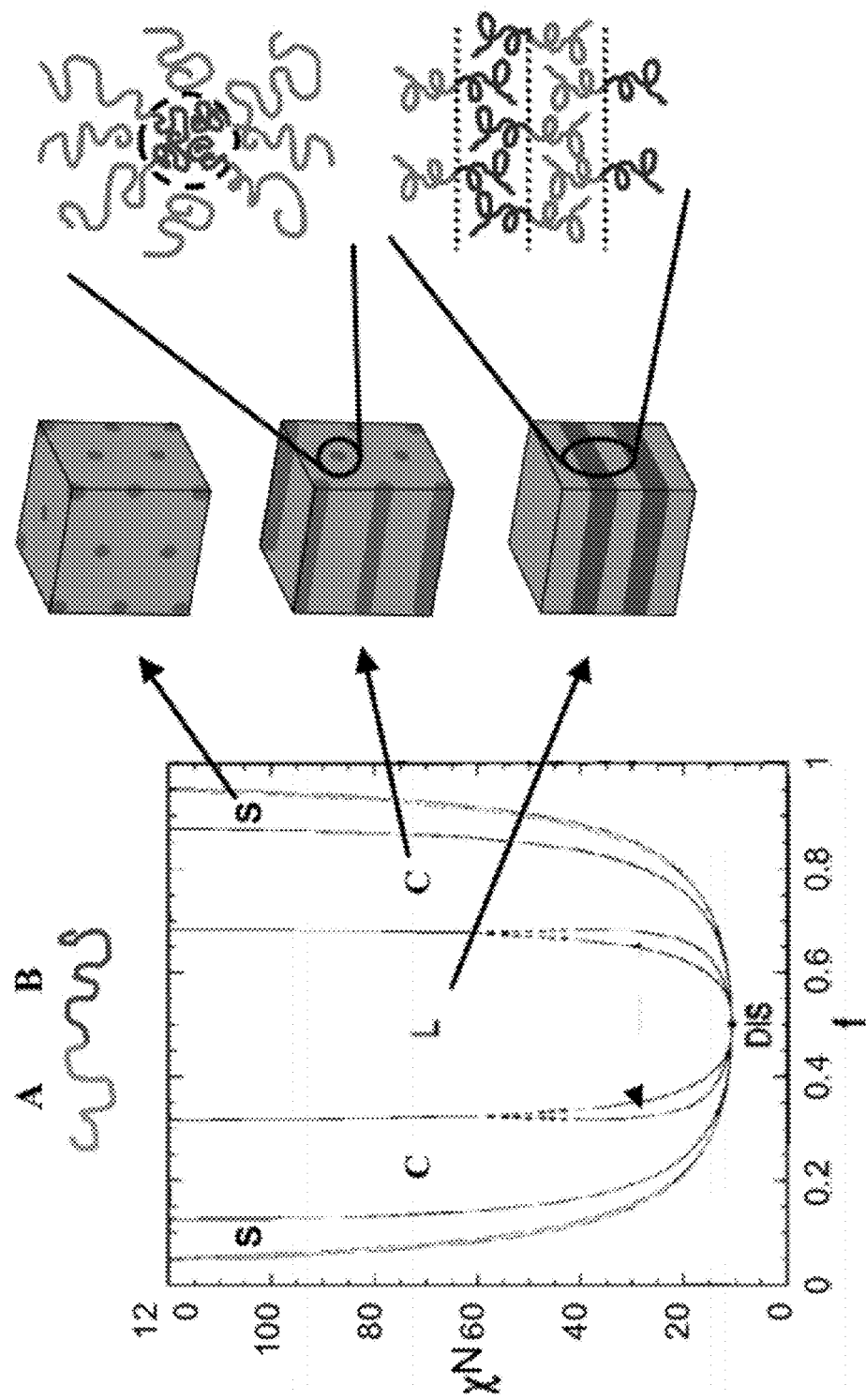
FIG. 1 shows an example of ideal phase behavior of diblock copolymers.

Provided herein are methods of directed self-assembly of block copolymers on patterns using solvent annealing, and the resulting thin films, structures, media or other compositions. Self-assembling materials spontaneously form structures at length scales of interest in nanotechnology. Block copolymers (also referred to herein as BCPs) are a class of polymers that have two or more polymeric blocks. The structure of diblock copolymer AB, also denoted A-b-B, may correspond, for example, to AAAAAAA-BBBBBBBB. FIG. 1 shows theoretical phase behavior of an A-b-B diblock copolymer. The graph in FIG. 1 shows, $\chi^N$ (where $\chi$ is the Flory-Huggins interaction parameter and N is the degree of polymerization) as a function of the volume fraction, f, of a block (A) in a diblock (A-b-B) copolymer. $\chi^N$ is related to the energy of mixing the blocks in a diblock copolymer and is inversely proportional to temperature. FIG. 1 shows that at a particular temperature and volume fraction of A, the diblock copolymers microphase separate into domains of different morphological features (also referred to as microdomains). As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 2 nm or 3 nm to 50 nm. The phase behavior of block copolymers containing more than two types of blocks (e.g., A-b-B-b-C), also results in microphase separation into different domains. The size and shape of the domains in the bulk depend on the overall degree of polymerization N, the repeat unit length a, the volume fraction f of one of the components f, and the Flory-Huggins interaction parameter, $\chi$.

A block copolymer material may be characterized by bulk lattice constant or period $L_0$. For example, a lamellar block copolymer film has a bulk lamellar period or repeat unit, $L_0$ equal to the width of two stripes. For cylindrical and spherical domain structures, the periodicity $L_0$ of the bulk domain structures can be characterized by a center-to-center distance between the cylinders or spheres, e.g., in a hexagonal array. While the FIG. 1 shows an example of phase behavior of a diblock copolymer for illustrative purposes, the phase behavior of triblock and higher order block copolymers also can results in microphase separation into different architectures.

FIGS. 2A and 2B show examples of directed assembly of lamellar (FIG. 2A) and cylindrical (FIG. 2B) ordered domains. Patterning of layers 205a and 205b is indicated at 210a and 210b, respectively, with the arrows representing radiation appropriate to pattern a layer, such as x-ray radiation, extreme ultraviolet (EUV) radiation or electron beam radiation. Layers 205a and 205b, which can be referred to as patternable layers or imaging layers, are layers of material that can be selectively altered to create a chemical pattern. In one example, a layer of polystyrene (PS) brushes anchored to a surface is used as an imaging layer. FIG. 2A shows layer 205a on a substrate 203, which can be a silicon (Si) wafer or other appropriate substrate. Patterning can include use of a resist as generally known to one having ordinary skill in the art to expose regions of the patternable layer to form the desired pattern, followed by chemical modification of the exposed regions; for example, exposed regions of a PS brush layer can be oxidized. Chemically patterned surfaces 207a and 207b are indicated at 220a and 220b, respectively, with surface 207a patterned with alternating stripes and surface 207b patterned with an array of spots. Block copolymer material 209a and 209b is deposited on the chemically patterned surfaces 207a and 207b, respectively, as indicated at 230a and 230b. The block copolymer material 209a and 209b is then induced to undergo microphase separation.

The chemically patterned surfaces 207a and 207b can direct the assembly of the block copolymer material 209a and 209b such that the phase-separated domains are oriented perpendicular to the underlying surface and registered with the chemical pattern. The assembled phase-separated thin films 211a and 211b are shown at 240a and 240b, respectively. Thin film 211a includes lamellae of first polymer 213a and second polymer 215a aligned with the stripes of the underlying chemical pattern. Thin film 211b includes cylinders of a first polymer 213b in a matrix of a second polymer 215b, with the cylinders and matrix aligned with the underlying chemical pattern.

Periodic patterns formed on substrates or in thin block copolymer films may also be characterized by characteristic lengths or spacings in a pattern. $L_s$ is used herein to denote the period, pitch, lattice constant, spacing or other characteristic length of a pattern such as surface pattern. For example, a lamellar period $L_s$ of a two-phase lamellar pattern may be the width of two stripes. In another example, a period $L_s$ of an array of spots may be the center-to-center distance of spots.

Surface energy, as used herein, refers to energy at the surface between a condensed and non-condensed phase, such as a solid block copolymer thin film or block copolymer film in the melt and a gas or vacuum. Interfacial energy, as used herein, refers to energy at the surface between two condensed phases, such as a solid block copolymer thin film or block copolymer thin film in the melt and a liquid or solid.

In embodiments described herein, microphase separation of the BCP thin films is induced by solvent annealing. According to various embodiments, solvent annealing can be used direct the assembly of BCPs on prepatterns, including chemical prepatterns, to achieve desirable attributes of directed assembly processes, including high degrees of pattern perfection, placement of features at the precision of the lithographic tool used to make the chemical pattern, improved dimensional control of features, improved line edge and line width roughness, and resolution enhancement by factors of two to four or greater. In addition, the methods described herein can achieve the canonical set of feature geometries used in the fabrication of integrated circuits. Solvent annealing may be advantageously used to direct self-assembly of BCPs that contain blocks with dissimilar surface energies, are thermally instable, or cannot reach thermal equilibration due to mass transport or other limitations. For example, large-molecular-weight BCPs have extremely slow chain mobility and demands high annealing temperature that may exceeds their thermal degradation temperature. Solvent annealing also provides additional control on BCP morphologies and periods.

Figure 3:
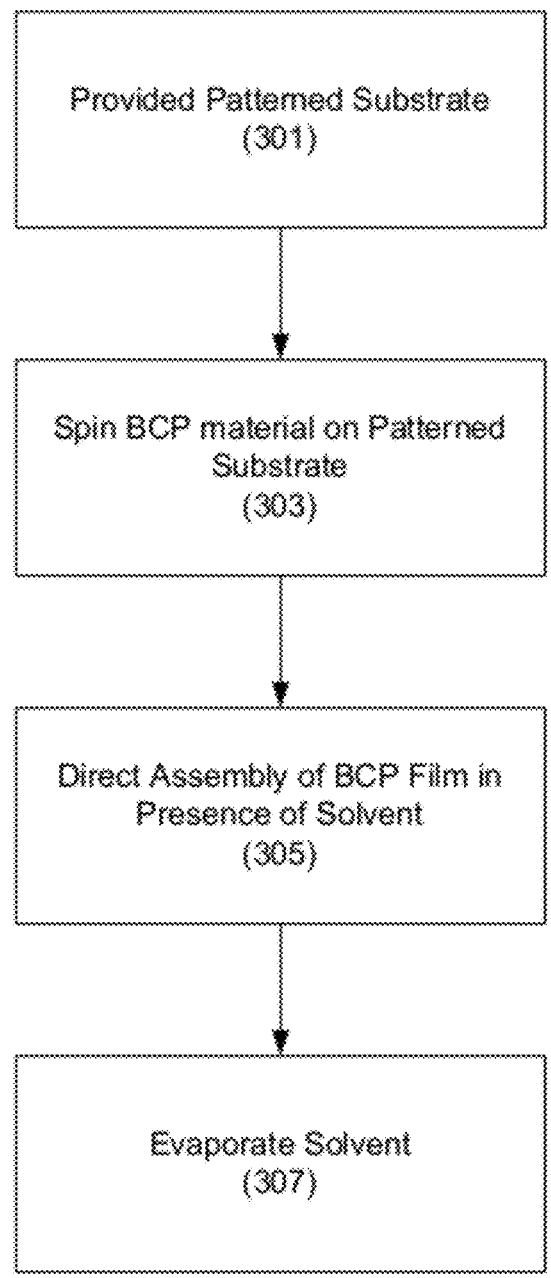
FIG. 3 shows an example of a process flow for fabricating block copolymer (BCP) thin film structures.

FIG. 3 is an example of a process flow for fabricating BCP thin film structures. First, a patterned substrate is provided at block 301. The substrate can be patterned with regions of different chemical compositions. Schematic examples of patterned substrates are shown at 220a and 220b in FIGS. 2A and 2B, discussed above. The substrate pattern will direct the assembly of the BCP thin film and so corresponds to the desired morphology of the thin film. In some embodiments, the substrate pattern period $L_s$ is commensurate to the vitrified BCP microdomain period $L_v$ of the BCP material to be deposited on the pattern.

The BCP material is then spun on (or otherwise deposited) on the patterned substrate at block 303. Schematic examples of unassembled BCP material on patterned substrates are shown at 230a and 230b in FIGS. 2A and 2B. The process continues at block 305 with directing the assembly of the BCP film in the presence of a solvent. In some embodiments, the substrate pattern is replicated in the assembled BCP film as described above. The absorbed solvent effectively lowers the glass transition temperature $T_g$, and can increase BCP chain mobility to obtain mass transport that may be unobtainable thermal annealed systems. Directed assembly of the BCP films can be performed at lower temperatures than "pure" BCPs, i.e., BCPs without absorbed solvent. Further, in some embodiments, the assembled BCP thin films have smaller periods than obtainable with pure BCPs.

Once the BCP film has been directed to assemble to the desired morphology, the solvent is allowed to evaporate at block 307. In some embodiments, block 307 can involve reducing the thickness of the BCP film while the lateral dimensions of the microdomains remain stable. That is, the microdomains may shrink in the z-direction orthogonal to the plane of the substrate, keeping their dimensions in the x- and y-directions. It is noted that in some embodiments, solvent evaporation does not contribute to the assembly of the BCP films in the process described with reference to FIG. 3. Without being bound by a particular theory, it is believed that the BCP films achieve a stable or meta-stable equilibrium state in block 305.

According to various embodiments, the solvent can be selective or non-selective. A selective solvent is one that prefers one of the blocks of the BCP. In the case of a triblock or higher order BCP, a selective solvent may prefer two or more blocks over another block of the BCP. A non-selective or neutral solvent is a solvent in which all blocks of the BCP have good solubility.

The choice of solvent can affect the maximum solvent volume fraction, morphology, and domain size of the assembled film. Phases of BCP/solvent systems can depend on the volume fraction of the solvent as well as the temperature and relative volume fractions of the blocks. For example, the morphology of a symmetric diblock copolymer annealed in a selective solvent at low temperature may change from lamellae, gyroid, cylinder, sphere, and micelles upon increase of solvent fraction.

Table 1, for example, below shows the effect of solvent choice on the swelling ratio, maximum volume fraction and morphology of a lamella-forming symmetric polystyrene-block-poly(2-vinyl pyridine) (PS-b-P2VP) (40k-b-40.5k) having an $L_0$ of about 53 nm.

TABLE 1

Effect of Solvent Choice on symmetric PS-b-P2VP

| Solvent | Swelling Ratio (max) | Solvent Volume Fraction (max) | Morphology | $L_v$ |
|---|---|---|---|---|
| Methanol | 168% | 0.63 | disordered | n/a |
| Toluene | 115% | 0.53 | cylindrical | 57 nm |
| DMF | 110% | 0.52 | cylindrical | 53 nm |
| $CS_2$ | 93.5% | 0.48 | cylindrical | 63 nm |
| Acetone | 41.2% | 0.30 | lamellar | 46 nm |

Thin films of the PS-2-P2VP on unpatterned surfaces were exposed to the solvent vapor at room temperature for a time period long enough to reach fully swollen state. Swelling ratio is the ratio of the solvent-containing film thickness to the pure film thickness, with the solvent volume fraction determined from the swelling ratio. The solvent volume fraction of a particular BCP at a particular temperature determines the morphology of the BCP. Depending on the nature of the solvent molecules, the swelling ratio of each block and the relative volume fraction may be greatly different, which may lead to different morphologies. While the PS-b-P2VP (40k-b-40k) is lamella forming in the bulk, annealing in methanol resulted in micellar structures, and annealing in toluene, dimethylformamide (DMF) and carbon disulfide ($CS_2$) resulted in parallel cylinders. After being annealed in acetone vapor, PS-b-P2VP (40k-b-40k) showed lamellar morphology, however, with the period $L_v$ decreased by 13% in comparison to $L_0$.

The selectivity of a solvent can vary according to the desired embodiment. Table 2 shows solvent selectivity for blocks of a PS-b-PMMA diblock for toluene, acetone and $CS_2$.

TABLE 2

Solubility of PS-b-PMMA blocks

| Solvent | PS | PMMA |
|---|---|---|
| Toluene | Soluble ($\chi_{PS\text{-}Toluene} = 0.34$) | Soluble ($\chi_{PMMA\text{-}Toluene} = 0.45$) |
| $CS_2$ | Soluble ($\chi_{PS\text{-}CS2} = 0.01$) | Insoluble ($\chi_{PMMA\text{-}CS2} = 1.2$) |
| Acetone | Insoluble ($\chi_{PS\text{-}Acetone} = 1.1$) | Soluble ($\chi_{PMMA\text{-}Acetone} = 0.29$) |

A neutral or non-selective solvent is a good solvent for both blocks of a diblock copolymer, and can decrease the effective interaction parameter such that $\chi_{eff} = \chi(1-f_{sol})$ where f is the volume fraction of the solvent. A strong selective solvent can increase the degree of segregation relative to the melt state. Accordingly, in some embodiments, domain size can be controlled by appropriately selecting a solvent.

Solvent annealing of symmetric PS-b-PMMA ultra-thin films led to different morphologies according to the varying solvent selectivity. A good solvent for both blocks, tetrahydrofuran (THF) induced a terraced morphology. Annealing in $CS_2$, a PS-selective solvent, caused disordered micellar structure. While annealed in acetone, a PMMA-selective solvent, the thin films exhibited different morphologies by varying the solvent annealing time.

Figure 4:
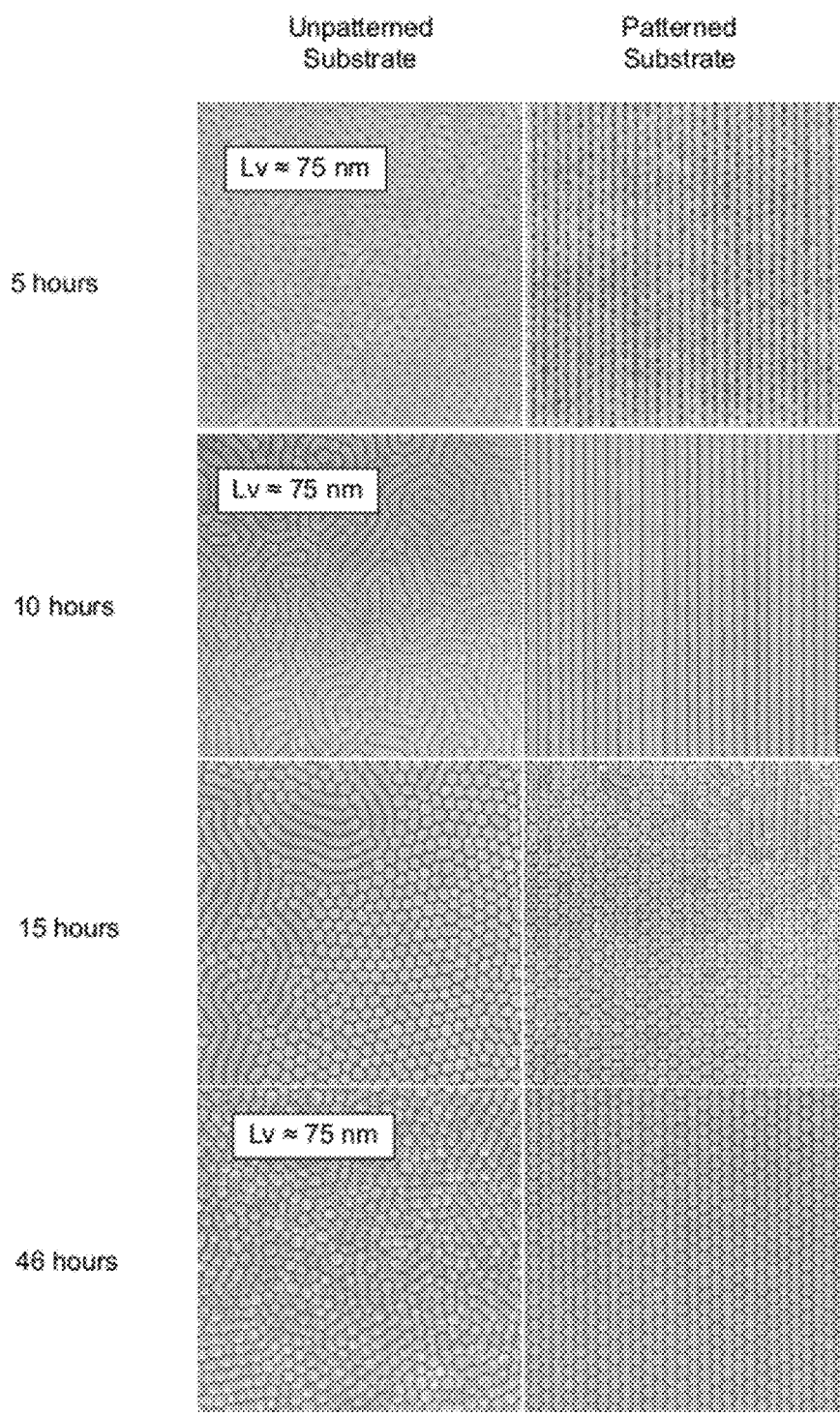
FIG. 4 shows top-down SEM images of PS-b-PMMA (95k-b-92k) ultrathin films on unpatterned surfaces (left column) and chemical patterns with a pattern period ($L_s$) of 70 nm (right column). The films were annealed in acetone vapor for 1.5-46h.

FIG. 4 shows top-down SEM images of PS-b-PMMA (95k-b-92k) ultrathin films on non-patterned area (left column) and alternating stripe chemical patterns with $L_s$=70 nm (right column). The films were annealed in acetone vapor for 1.5-46 h.

On the non-patterned area (PS—OH grafted silicon substrate), the BCP film morphology changes along with increasing exposure time to acetone vapor. The film became featureless after 1.5 h annealing (not shown). Dots of PMMA started to appear and dominate the whole film after 5 h annealing. 10 h exposure to acetone vapor resulted in fingerprint patterns. These stripped structures turned into and were maintained in honeycomb structure (PS spheres) with increasing annealing time. The periodicity $L_v$ of the PMMA dots, stripes, and PS spheres are all approximately 75 nm (rod-to-rod distance for PMMA dots and PS spheres). All three different BCP morphologies were directed to assemble by the grating chemical patterns. With different annealing times, the BCP films appeared the same morphologies on the $L_s$=70 nm chemical patterns as those on the non-patterned areas. PMMA dots aligned on the chemical patterns emerged after 3 h annealing (not shown) and formed pseudo long-ranged ordered hexagonal dot patterns after 5 h annealing. Long-range ordered and well registered stripes were observed after 10 h annealing. Annealing for longer time (15 h) resulted in the mixture of aligned stripes and PS spheres. Close packed honey-comb shape PS spheres formed on chemical patterns after annealing for 46 h.

The results in FIG. 4 demonstrate that morphology can be controlled by anneal time as well as by choice of solvent. The results also demonstrate that any type of feature formed in the bulk or on an unpatterned surface can be directed to assemble by the appropriate chemical pattern.

In some embodiments, the solvent also may be selected to manipulate the difference between blocks of the block copolymer in surface energy at the free surface. For example, in certain embodiments, a solvent that reduces the difference in surface energy between block A and the free surface and block B and the free surface. This can facilitate microdomains that are perpendicular to the substrate extending through the entire thickness of the thin film. In some embodiments, a non-preferential or weakly preferential solvent may be chosen to reduce the difference.

Thermal annealing can result in a thin top layer of one block due to different surface energies at the free surface. For example, thermal annealing of PS-b-P2VP can result in PS on the PS-b-P2VP films due to the smaller surface tension of PS. An additional etching may remove the top layer, which may alter the surface properties and cause the decrease of the pattern aspect ratio. In some embodiments, the solvent may mediate the polymer-air (or other free surface) interface energy such that no top wetting layer forms, with the microdomains extending through the thickness of the BCP film.

In some embodiments, a BCP having blocks with a higher differential surface energy than PS-b-PMMA at the temperature of assembly may be used, facilitated by the solvent. Due to the very similar surface tension ($\gamma_s$) between the PS and PMMA blocks at about 170-230° C., PS-b-PMMA facilitates generating perpendicularly oriented microdomains (e.g., lamellae or cylinder) through a film thickness. BCPs that have smaller dimensions, higher etching selectivity or other specific properties than PS-b-PMMA generally contain blocks with dissimilar $\gamma_s$, which can cause preferential wetting of one block at the free surface of the film and/or lead to parallel microdomain structures. The methods described herein can allow the formation of perpendicular domains of these BCPs through the thickness of the film. The pattern formed by the perpendicular structures can be readily transferred after removal of one domain by wet or dry etching.

One factor in achieving perfect or near perfect assembly on chemical patterns is the selective interaction between BCP blocks and the chemically patterned surface. During solvent annealing, the solvent to surface interaction may screen the interaction between BCP blocks and chemical patterns. The screening effect may increase with dilution of the BCP films. In some embodiments, the methods may include controlling solvent volume fraction and the solvent selectivity. For example, both high selectivity and low solvent volume fraction may be used such that the interaction between at least one block and a patterned region (e.g., a PS block and PS brush patterned features) is sufficient to induce directed self-assembly. Relatively low solvent volume fractions, e.g., less than about 50% or less than about 40%, can facilitate directed assembly in some embodiments, though for some systems a higher solvent volume fraction may be tolerated.

In some embodiments, solvent annealing conditions, including solvent, temperature, and solvent volume fraction are selected such that the microdomain structures are formed in the solvated state, rather than during solvent evaporation. Without being bound by a particular theory, it is believed that directed assembly on chemical patterns via solvent annealing follows a mechanism in which the quasi-equilibrium is achieved the solvated state and quenched, rather than a nucleation and growth mechanism by which ordering forms during solvent evaporation at the interface with free surface and propagates down. In some embodiments, however, there may be some amount of ordering induced by nucleation at the free surface interface, in addition to forming microdomain structures in the solvated state.

In some embodiments, the solvent annealing conditions are chosen such that equilibrium or quasi-equilibrium ordered structures are formed in the solvated state and are retained after solvent evaporation. In some embodiments, the solvent annealing conditions are further chosen such the domains are ordered perpendicular to the substrate. The films are annealed for a sufficient time to reach an equilibrant state and can achieve perfect or nearly perfect assembly on chemical patterns. Without being bound by a particular theory, it is believed that after a BCP film is exposed to solvent vapor, the chain mobility increases with swelling ratio and when the chain mobility is sufficient, microdomain structures forms. The morphology depends on the solvent and the swelling ratio, and does not change over time at the same swelling ratio. For instance, parallel hexagonally packed cylinders and stretched body centered cubic (BCC) packed spheres can be formed while annealing PαMS-b-PHOST thin films in THF and acetone respectively. In the rapidly dried films, both morphologies are maintained except with compression in the direction normal to the substrates due to the uniaxial contraction.

Figure 5:
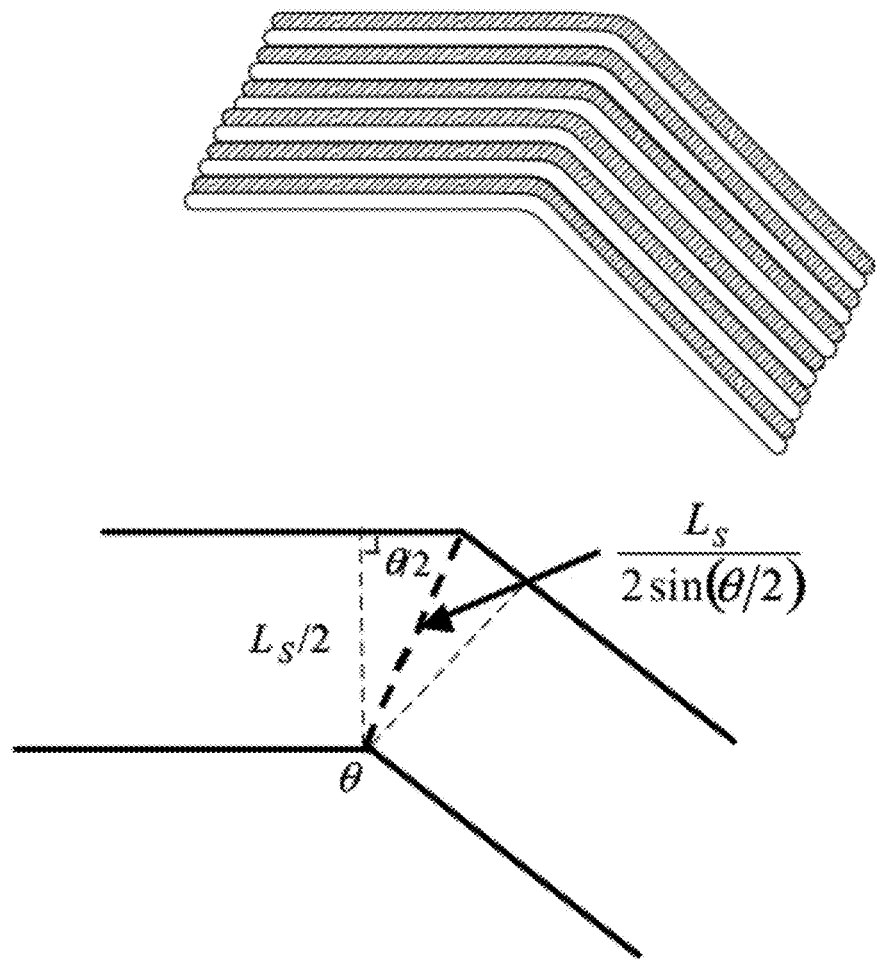
FIG. 5 is a schematic example of a pattern including a varying effective pattern period.
Figure 6A:
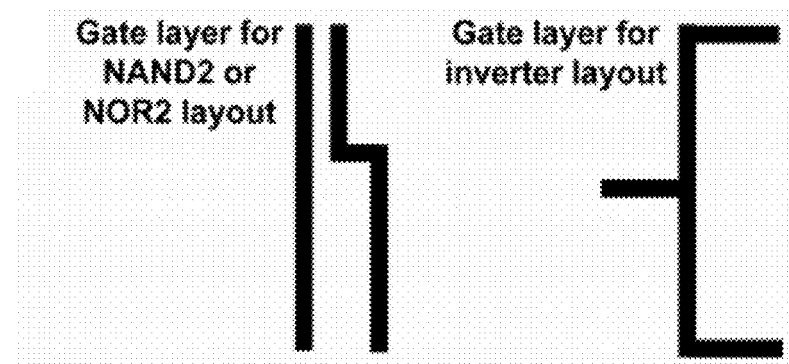
FIG. 6A shows examples of patterns that may be used integrated circuit and logic device fabrication.
Figure 6B:
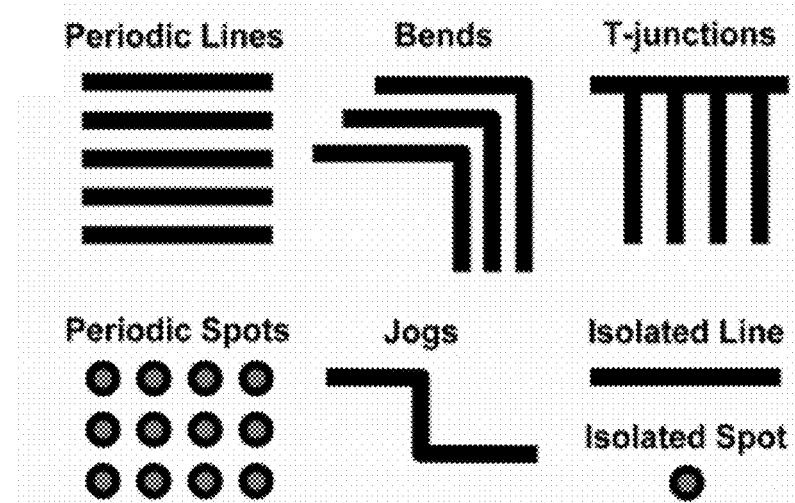
FIG. 6B shows examples of types of pattern features that may be used integrated circuit and logic device fabrication.

The pattern used to direct the assembly of the BCP can be regular, such as an alternating stripe pattern, a hexagonal array of spots, etc., or contain irregular features such as bends, jogs and T-junctions, as well or other irregular features in which the effective pattern period is non-constant. An example is depicted in FIG. 5, which shows the distance between interfaces of an irregular feature (a bend) in a pattern. With $L_s$ equal to the width of two stripes, assuming a symmetric pattern where the shaded and unshaded stripes are of equal width, the distance between interfaces is $½L_s$ along the unbent linear portions of the pattern. At the bend corner, however, the distance between interfaces is $L_s/2\sin(\theta/2)$— comparable to having a period of $L_s/\sin(\theta/2)$. Thus the effective period at the bend corner $L_c$ is $L_s/\sin(\theta/2)$. The bent nonlinear portions of the pattern in FIG. 5 have different periods than the linear portions. FIG. 6B depicts other features that may be included in a pattern in certain embodiments, including bend, t-junction and jog features that have non-constant effective pattern periods. Patterns of spots and parallel or non-parallel lines may also have varying spacing and periods across a pattern. In some embodiments, such patterns can be used for pattern transfer and integrated circuit fabrication. For example, FIG. 6A shows generalized layouts for gate layers for a NAND2 or NOR2 layout and an inverter layout. The NAND2 or NOR2 gate layer includes a jog and the inverter gate layer includes both a t-junction and sharp 90° angles. In addition to lamellae-forming BCPs, in some embodiments, cylinder-forming or sphere-forming BCPs can be directed to assemble on spot chemical patterns, which may find applications in bit patterned storage media. Many integrated circuit layouts can be for pattern transfer or fabrication of contacts or contact holes. These features may be patterned either as dense arrays or as isolated structures, for example with sub-32 nm, sub-22 nm or smaller critical dimensions.

The pattern period, or range of effective pattern periods, is commensurate with the vitrified BCP microdomain period, $L_v$. The vitrified BCP microdomain period $L_v$ is the period of the solvated block copolymer when the BCP has reached an immovable state, and is dependent on the particular solvent used. The $L_v$ of an assembled BCP can be measured experimentally before or after solvent evaporation by X-ray scattering or other appropriate measurement, or can be obtained through simulation or reference. While the slow dynamics of many BCP systems indicate that the lateral dimensions of the ordered BCP films do not change upon fast evaporation, it is possible that there may be some small (e.g., on the order of a 1 or 2 nm) amount of change in the measured period. In some embodiments, a desired pattern period or range of pattern periods in an assembled film is identified, with the BCP/solvent system having a commensurate $L_v$ then chosen.

It is noted that the $L_v$ may be significantly different that the natural period $L_o$ of the block copolymer. In some embodiments, the range of effective pattern periods is between +/−0.1$L_v$, though depending on the particular system a wider range of pattern periods may be tolerated, e.g., +/−0.2$L_v$, to direct the assembly of the BCP. For example, triblock or higher order BCPs may tolerate a 20% or higher discrepancy between the pattern period and $L_v$. The chemical pattern matches the swollen domain sizes such that solvent-swollen block copolymer material can equilibrate in the presence of the chemical pattern.

Figure 7:
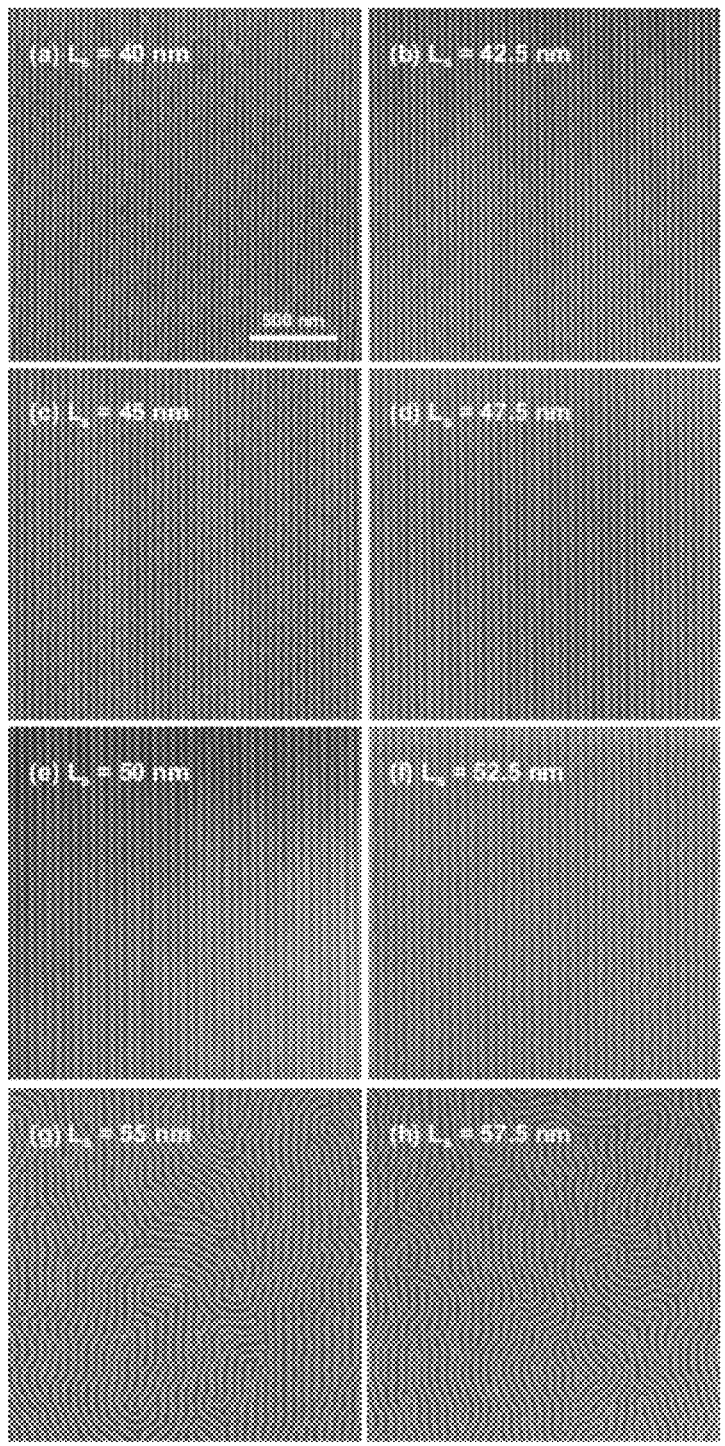
FIG. 7 shows top-down SEM images of solvent annealing induced directed assembly on 1:1 chemical patterns. 30 nm thick PS-b-P2VP (40k-b-40k) films were annealed in acetone vapor on chemical patterns with periods of $L_s$=40 nm, 42.5 nm, 45 nm, 47.5 nm, 50 nm, 52.5 nm, 55 nm, and 57.5 nm.

FIG. 7 shows SEM images of 30 nm thick PS-b-P2VP (40k-b-40k) films cast on chemical patterns of 40 nm≤$L_s$≤57.5 nm and annealed in acetone vapor. The vitrified BCP microdomain period $L_v$ is about 46 nm (see Table 1). The registration and ordering of the BCP microdomains is nearly perfect over the entire imaged area for $L_s$=42.5, 45, 47.5 and 50 nm, with only a few dislocation defects observed on the $L_s$ 40 and 52.5 nm prepatterns. The period of these ordered and registered BCP domains ($L_p$) equals $L_s$. This shows that for this BCP/solvent system, a pattern having a period or range of effective periods of +/−0.15$L_v$ may be replicated. When $L_s$=55 and 57.5 nm, the BCP film was largely disordered and unregistered with respect to the prepatterns, however a small portion of lamellae were oriented in the direction of the prepattern at $L_s$=55 nm.

Figure 8:
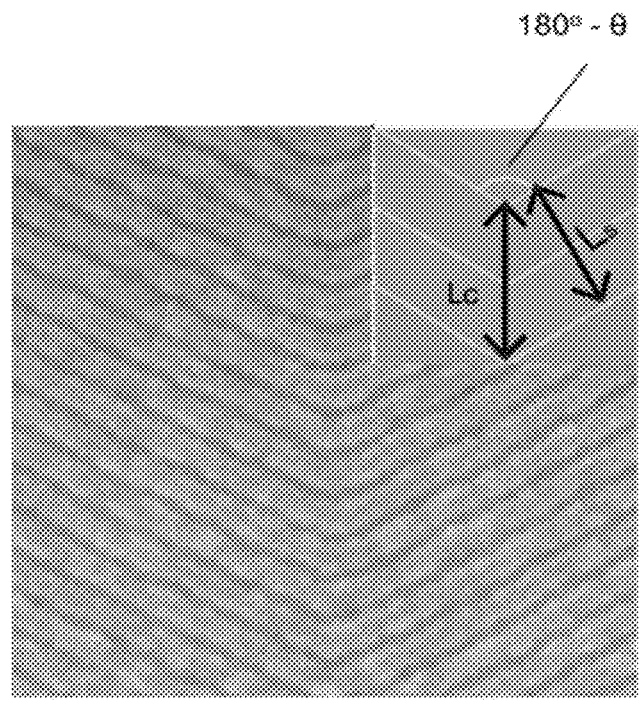
FIG. 8 shows top-down SEM images of PS-b-PMMA (95k-b-92k) ultrathin films annealed in acetone vapor for 10 h on chemical patterns with $L_s$=75 nm and bend angles of $\theta$=60°, 90°, 120°, and 150°.
Figure 8:
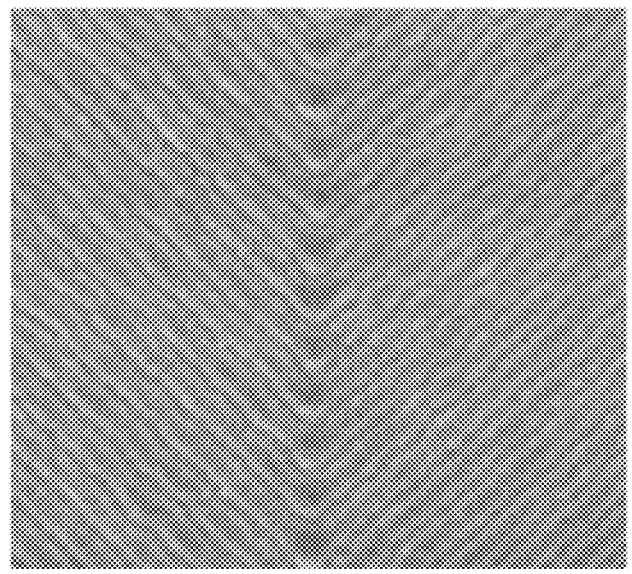

In some embodiments, patterns having one or more irregular features that have effective periods that differ significantly from $L_v$ can direct assembly of the BCP. FIG. 8 shows the top-down SEM images of PS-b-PMMA (95k-b-92k) films directed to assembly via solvent annealing on irregular patterns. The BCP films were annealed in acetone for 10 h. Directed assembly with high perfection was observed on the linear portions of the chemical patterns. On bended chemical patterns, the corner-to-corner period, $L_c$, increases with bend angle, θ (see inset in the θ=90° image, which shows the angle 180°−θ). The corner-to-corner period, $L_c$=$L_s$/cos(θ/2) is 86.6 nm, 106.1 nm, 150 nm, and 289.8 nm for 60°, 90°, 120°, and 150° bends respectively. Defects at the corner would be expected $L_c$ is larger than the largest $L_s$ of chemical patterns that can direct nearly perfect assembly. For PS-b-PMMA (95k-b-92k) annealed in acetone for 10 h, $L_v$ is about 75 nm, with the largest chemical pattern period that directed near perfect assembly was about 85 nm. Using solvent annealing, directed assembly was even observed on chemical patterns with 60°, 90° and 120° bends, despite having an effective pattern period ranging from 1.15 $L_v$ to about 2$L_v$. Without being bound by a particular theory, it is believed that the absorbed solvent redistributes to accommodate irregular features and facilitate defect-free assembly at bends and other irregular features.

Figure 9:
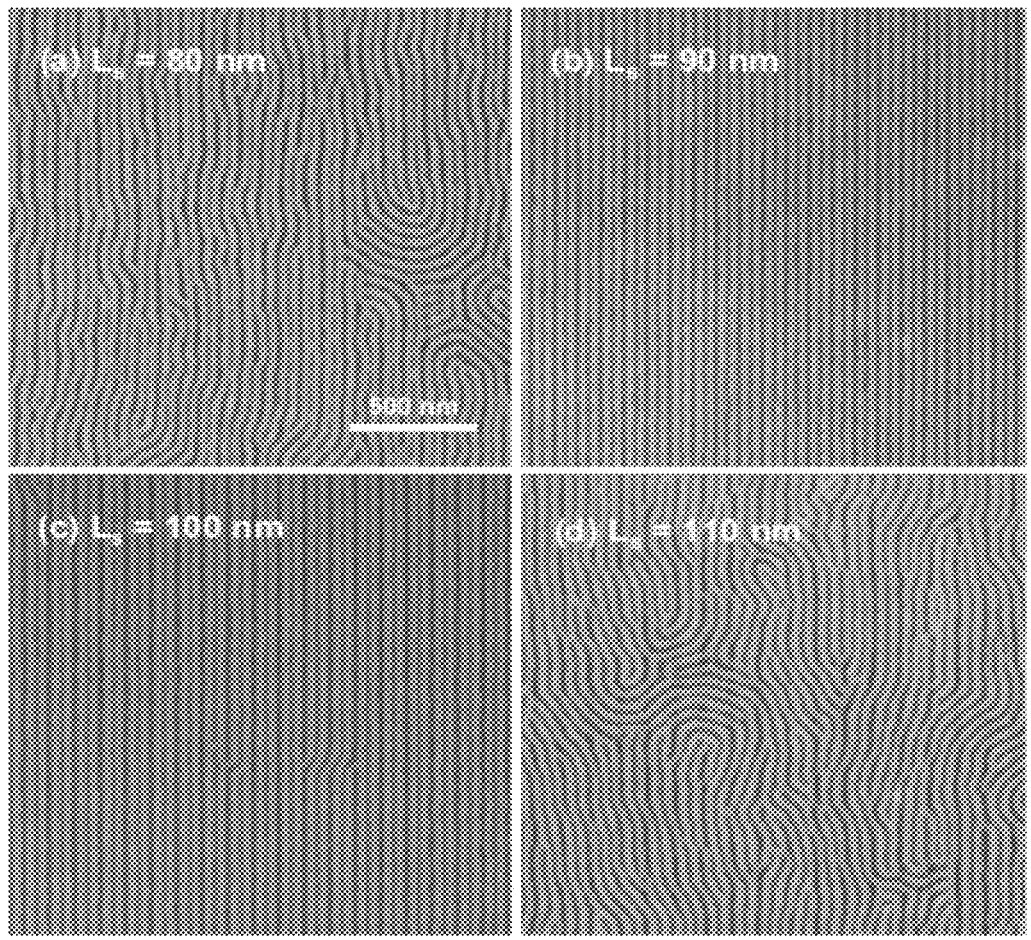
FIG. 9 shows top down SEM images of solvent annealing induced directed assembly on 1:2 chemical patterns. 30 nm thick PS-b-P2VP (40k-b-40k) films were annealed in acetone vapor on chemical patterns with periods of $L_s$=80 nm, 90 nm, 100 nm, and 110 nm.

In some embodiments, directed assembly via solvent annealing can involve density multiplication of the substrate pattern. Density multiplication refers the density of features in an assembled film being greater than that of the patterned substrate. The substrate pattern can have a period $L_s$ commensurate with n$L_v$, with n equal to an integer greater than 1. For example, $L_s$ may be n$L_v$+/−0.1n$L_v$. FIG. 9 shows top-down SEM images of assembled PS-b-P2VP (40k-b-40k) on a series of chemical patterns with 80 nm≤$L_s$≤110 nm or about 1.75$L_v$≤$L_s$≤2.4$L_v$. Assembly with high perfection occurred on chemical patterns with $L_s$=90 nm (about 1.95$L_v$) and 100 nm (about 2.2$L_v$) except a few dislocation defects were observed on $L_s$=100 nm prepatterns. At $L_s$=80 nm and 110 nm there are more dislocation defects and unregistered lamellae.

Figure 10:
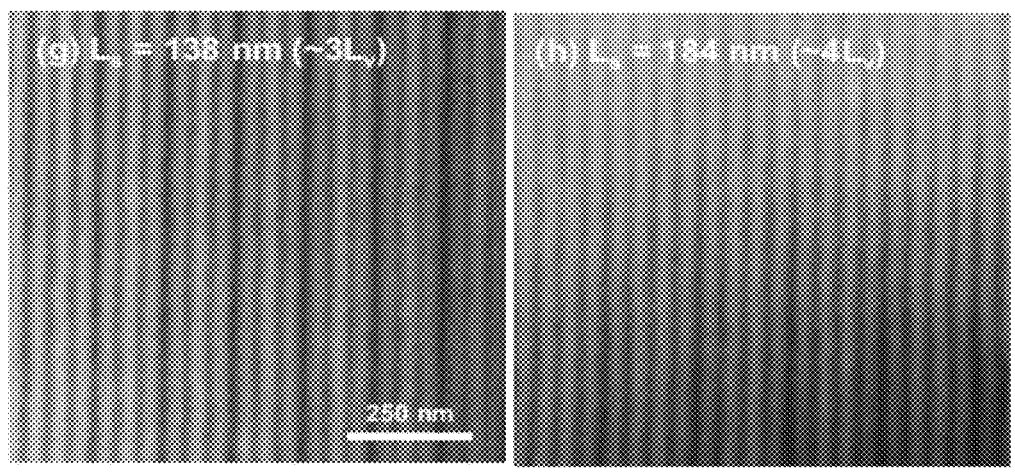
FIG. 10 shows top down SEM images of solvent annealing induced triple and quadruple density multiplication on chemical patterns. 30 nm thick PS-b-P2VP (40k-b-40k) films were annealed in acetone vapor on chemical patterns with periods of $L_s$=138 nm and 184 nm.

FIG. 10 shows top-down SEM images of thin films of PS-b-P2VP (40k-b-40k) directed to assemble on chemical patterns with $L_s$ of 138 nm (about $3L_v$) and 184 (about $4L_v$).

Parameters

The following are examples of substrates, patterning techniques, patterns, and block copolymer materials that may be used in accordance with certain embodiments.

Substrate

Any type of substrate may be used. In semiconductor applications, wherein the block copolymer film is to be used as a resist mask for further processing, substrates such as silicon or gallium arsenide may be used. For patterned media applications, a master pattern for patterned media may be made on almost any substrate material, e.g., silicon, quartz, or glass.

According to various embodiments, the substrate may be provided with a thin film or imaging layer thereon. The imaging layer may be made of any type of material that can be patterned or selectively activated. In a certain embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane.

In certain embodiments, the imaging layer or thin film to be patterned is a polymer brush layer. In certain embodiments, the polymer brush may include one or more homopolymers or copolymers of the monomers that make up the block copolymer material. For example, a polymer brush of at least one of styrene and methyl methylacrylate may be used where the block copolymer material is PS-b-PMMA. One example of a polymer brush to be used in a thin film is PSOH. In some embodiments, a pattern may be provided without an underlying substrate, for example as an unsupported polymer film.

Patterning

Patterns may be formed by any method, including all chemical, topographical, optical, electrical, mechanical patterning and all other methods of selectively activating a substrate. A chemically patterned surface can include, for example, patterned polymer brushes or mats, including copolymers, mixtures of different copolymers, homopolymers, mixtures of different homopolmyers, block oligomers, and mixtures of different block oligomers. In embodiments where a substrate is provided with an imaging layer (such as a self-assembled monolayer or polymer brush layer) patterning the substrate may include patterning the imaging layer. In some embodiments, patterning may include forming background regions that are non-preferential or weakly preferential to the component blocks of the BCP.

A substrate may be patterned by selectively applying the pattern material to the substrate. In some embodiments, a resist can be patterned using an appropriate method. The substrate patterning may include top-down patterning (e.g. lithography), bottom-up assembly (e.g. block copolymer self-assembly), or a combination of top-down and bottom-up techniques. In certain embodiments, the substrate is patterned with x-ray lithography, extreme ultraviolet (EUV) lithography or electron beam lithography. In certain embodiments, a chemically patterned surface can be prepared using a molecular transfer printing method as disclosed in US 2009-0260750, titled "Molecular Transfer Printing Using Block Copolymers," incorporated by reference herein.

Pattern

Substrate surface patterns, or other patterns that direct the assembly of block copolymer (as well as the block copolymer material used) affect self-assembled domains that result from the processes described above. The surface pattern and the BCP film deposited on it can be chosen to achieve the desired pattern in the block copolymer film. In certain embodiments, there is a 1:1 correspondence between the number of features patterned on the substrate (by e-beam lithography or other technique) and the number of features in the self-assembled block copolymer film. In other embodiments, there may be a 1:2, 1:4 or other correspondence, with the density of the substrate pattern multiplied as described in US 2009-0196488, titled "Density Multiplication And Improved Lithography By Directed Block Copolymer Assembly" incorporated by reference herein. It should be noted that in certain cases, the 1:1 correspondence (or 1:2, etc.) might not be exactly 1:1 but about 1:1, e.g., due to imperfections in the substrate pattern.

The directed assembly may or may not be epitaxial according to various embodiments. That is, in certain embodiments, the features as defined by the block copolymer domains in the block copolymer film are located directly above the features in the chemical contrast pattern on the substrate. In other embodiments, however, the growth of the block copolymer film is not epitaxial. In these cases, the chemical contrast (or other substrate pattern) may be offset from the self-assembled domains. Even in these cases, the block copolymer domains are typically spatially registered with the underlying chemical pattern, such that the location of a block copolymer domain in relation to a location of a patterned feature is precisely determined. In some embodiments, registered block copolymer domains are aligned such that an interface between domains overlies an interface between the adjacent pattern features. In some other embodiments, registered domains may be offset from and/or differently sized than the underlying pattern features.

In certain embodiments, the pattern corresponds to the geometry of the bulk copolymer material. For example, hexagonal arrays of cylinders are observed bulk morphologies of certain block copolymers, and a pattern can include a hexagonal array. However, in other embodiments, the substrate pattern and the bulk copolymer material do not share the same geometry. For example, a block copolymer film having domains of square arrays of cylinders may be assembled using a material that displays hexagonal arrays of cylinders in the bulk.

The individual features patterned on the substrate may be smaller than or larger than the mean feature size of the block copolymer domains (or the desired feature size). In certain embodiments, the pattern has at least one dimension within an order of magnitude of a dimension of one domain in the block copolymer material.

In some embodiments, a pattern may include a varying effective pattern period. In some embodiments, a pattern may be characterized as having a pattern period $L_s$ that represents that length scale of uniformly spaced features that may dominate or be a major part of a pattern. For example, the pattern period $L_s$ in the example depicted in FIG. 5 is the width of straight portions of adjacent stripes. Irregular features such as bends and t-junctions may give rise to effective pattern periods that differ from the pattern period $L_s$. In some embodiments, a pattern may not have any one length scale that dominates the pattern, but have a collection of features and associated effective pattern periods. In some embodiments, the effective pattern period $L_{s\text{-}eff}$ may vary by up to about 30%, 40%, 50% or 100% or greater across the pattern.

Further examples of patterns are described in US-2006-0134556, titled "Methods And Compositions For Forming Aperiodic Patterned Copolymer Films" and in US-2008-0299353, titled "Methods And Compositions For Forming Patterns With Isolated Or Discrete Features Using Block Copolymer Materials," both of which are incorporated by reference herein.

Solvent/BCP System

Any type of copolymer that undergoes microphase separation in the presence of a solvent may be used. This includes block copolymers that have as components glassy polymers such as PS and PMMA, which have relatively high glass transition temperatures, as well as more block copolymers that have more elastomeric polymers as components. Other examples of components of BCPs include polyethylene oxide (PEO), polydimethylsiloxane (PDMS), poly-2-vinylpyridine (P2PV), poly-4-vinylpyridine (PS-P4VP), polyacrylate, polypropylene oxide (PPO), polyethylene, polyacrylonitrile (PAN), polylactide, polyacrylic acid (PAA), and polyisoprene. In some embodiments, a block copolymer can be chosen based on a desired chemical or functional characteristic of one or more components blocks, such as etch selectivity. Diblocks or higher order block copolymers can be used.

Block copolymer materials having various bulk morphologies may be used, including lamellae-forming block copolymers, cylinder-forming block copolymers, and sphere-forming block copolymers. Asymmetric and symmetric block copolymers can be used. The block copolymer material may include one or more additional block copolymers. In some embodiments, the material may be a block copolymer/block copolymer blend. The block copolymer material may also include one or more homopolymers.

The block copolymer material may include any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

As described above, in some embodiments, solvent annealing in the presence of chemical patterns can be leveraged to fabricate complex structures having a range of effective pattern periods. As such, in some embodiments, the block copolymer material includes a BCP without homopolymers and/or without other swellable materials. In some other embodiments, the block copolymer material may include a homopolymer or swellable material, for example, to increase commensurability tolerance.

As described above, the choice of solvent can depend on the block copolymer system and the desired morphology and dimensions of the assembled film. While the example of FIG. 3 uses a volatile solvent, in some embodiments, a non-volatile solvent that remains in the assembled film may be used. The solvent may be selective or non-selective to one or more of the components of the block copolymer material. At least one block of the block copolymer is typically soluble in the solvent. In some embodiments, a mixture of solvents may be used to achieve the desired characteristics, such as $L_v$, volume fraction, etc.

The solvent may be inorganic or organic. Examples of solvents include alcohols including methanol, ethanol, propanol, isopropanol, and butanol, ketones such as acetone. Further examples include tetrahydrofuran, acetone, dioxane, acetonitrile, dimethylsulfoxide, dimethylformamide, and carbon disulfide. In some embodiments, the solvent may be a mixture of two or more solvents.

EXPERIMENTAL

EXAMPLE 1

Effect of Solvent Choice on BCP Film Morphology and Period 30-nm-thick films of PS-b-P2VP (40k-b-40k) were coated on homogeneous substrates grafted by a series of PS-r-P2VP-r-PHEMA containing 41.8%-67.6% styrene and then annealed in acetone, N,N-dimethylformamide (DMF), toluene, carbon disulfide ($CS_2$), and methanol for 16 h, 2 h, 9 h, 20 h, and 16 h respectively. 200-nm-thick films of PS-b-P2VP (40k-b-40k) on $PS_{60.8\%}$-r-P2VP-r-PHEMA brush were annealed in DMF and acetone for cross-sectional SEM imaging. PS-b-P2VP (40k-b-40k) thin films showed various morphologies and periods after being annealed in different solvent vapors.

PS-b-P2VP was chosen as an illustrative system since it is difficult for thermal annealing due to the large difference in surface tensions between PS and P2VP blocks, and it has relatively high Flory-Huggins interaction parameter ($\chi$ of about 0.217 at 20° C.).

Figure 11A:
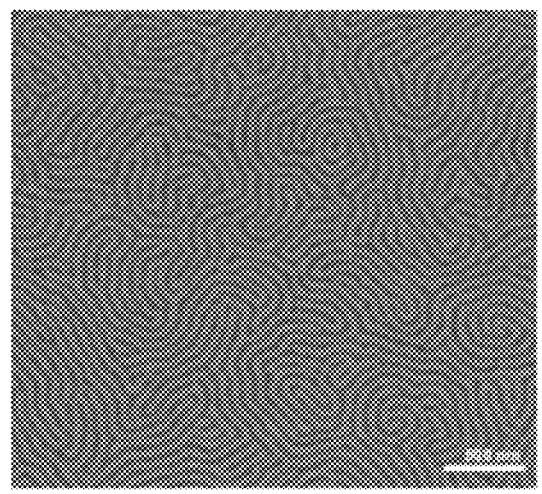
FIGS. 11A and 11B show images of acetone annealed PS-b-P2VP (40k-b-40k) films on $PS_{60.8\%}$-r-P2VP-r-$PHEMA_{2\%}$ grafted silicon substrates.
Figure 11B:
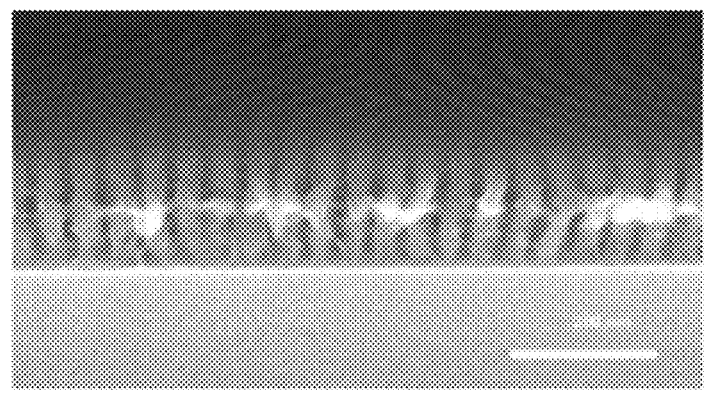

Only micellar structure was observed on films annealed in methanol vapor. Toluene and $CS_2$ vapor resulted in uneven films with fingerprint patterns on all brushes. The period $L_v$ of the toluene solvated film and the $CS_2$ solvated film was 57 and 63 nm, respectively. Annealing in DMF vapor for 2 h led to flat films with fingerprint patterns and a $L_v$ of about 53 nm on PS-r-P2VP-r-PHEMA brushes containing ≥60.8% styrene. The cross-sectional SEM image (not shown) showed that the fingerprint patterns were composed of cylinders parallel to the substrate. After being annealed in acetone vapor, the PS-b-P2VP (40k-b-40k) films showed "island-hole" structures on all brushes except that fingerprint patterns with $L_v$ of about 46 nm were observed on $PS_{60.8\%}$-r-P2VP-r-PHEMA grafted substrate as shown by the top-down SEM image (FIG. 11A). The film remained smooth after solvent annealing with a roughness rms=0.6 nm for a 2×2 $\mu m^2$ area determined by an AFM height image (not shown). The cross-sectional SEM image (FIG. 11B) shows the formation of perpendicular lamellae, indicating that the $PS_{60.8}\%$-r-P2VP-r-PHEMA brush provides a non-preferential surface for the assembly of PS-b-P2VP (40k-b-40k) in acetone. It is noted that perpendicular lamellae are not obtained by thermal annealing this system.

All films were annealed in saturated solvent vapor for a time period long enough to reach fully swollen state. Depending on the nature of each solvent molecules, the swelling ratio of each block and the relative volume fraction may be greatly different, which may lead to different morphologies. Under thermal annealing, PS-b-P2VP (40k-b-40k) forms lamellae with $L_0$ of 53 nm in bulk or in thin films. After being annealed in acetone vapor, PS-b-P2VP (40k-b-40k) also showed lamellae morphology, however, with period decreased by 13% in comparison to $L_0$. Addition of a neutral non-selective solvent will tend to decrease the lateral spacing and thus decrease stretching normal to the interface, resulting in a reducing $L_0$, while a strong selective solvent induces an increasing $L_0$ since the chains stretch to reduce interfacial area. Without being bound by a particular theory, it is believed that a phase diagram for the PS-b-P2VP/acetone system may be similar to a symmetric poly(styrene-b-isoprene) (PS-b-PI) system in a selective solvent. At room temperature, the phase diagram for PS-b-PI shows the BCP morphology changing from lamellae, gyroid, cylinder, sphere, and then micelles upon increase of solvent fraction. For PS-b-P2VP, acetone is slightly selective for P2VP block and only swells the film by 41%, with the resulting BCP film retaining its lamellae morphology. The BCP films reached their immovable state while at least one block vitrified.

The results of acetone annealed films show the formation of perpendicular oriented lamellae and preferential wetting of the BCP films on the brushes. When PS-b-P2VP films are thermal annealed, the polymer-air free surface is preferentially wetted by the block with lower surface tension (PS block), which results in an orientation of the cylindrical or lamellar microdomains parallel to the surface. Here, perpendicularly oriented lamellae were obtained. This is likely due to the saturated vapor of acetone neutralizing the free interface. Unlike solvent/BCP systems in which highly-ordered BCP microdomains form at the top surface and propagate into the film as the solvent evaporates leading to perpendicular orientation, it is believed that the PS-b-P2VP/acetone system reaches quasi-equilibrium in its swollen state with its orientation governed by both the substrate and the free surface. In comparison to thermal annealed films, the composition of the non-preferential wetting brush for the symmetric BCP is slightly different due to the presence of solvent.

In situ film thickness measurements indicated that the adsorbed solvent evaporated quickly (within 3 s) after exposing the films to air. It is believed that the lateral dimensions do not change on fast evaporation, while uniaxial contraction along the direction normal to the substrate may occur. The dynamics of PS-b-P2VP (40k-b-40k) are too slow to reach an equilibrant state during rapid drying. Here, long-range ordered patterns of perpendicular lamellae formed on chemical patterns in the solvated films after a long time annealing with relatively low swelling ratio. Upon fast drying, the films only contracted in thickness, which did not affect the dimension of the perpendicular lamellae. These results are consistent with a quasi-equilibrium-and-quenching mechanism.

EXAMPLE 2

Figure 12:
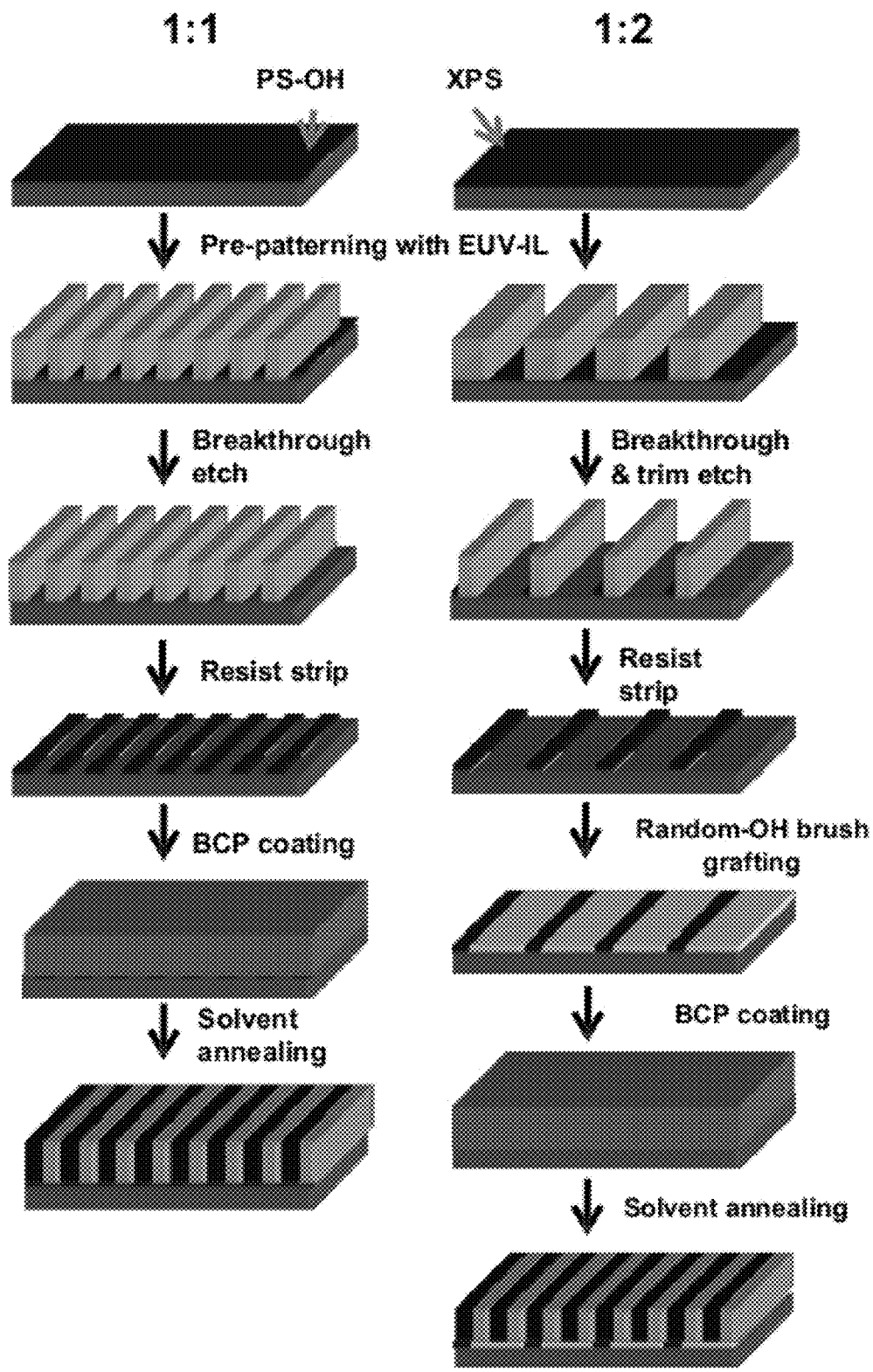
FIG. 12 shows a schematic illustration of operations in processes of directing assembly of BCPs on 1:1 and 1:2 chemical patterns via solvent annealing.

Chemical Patterning of and Solvent Annealing-induced Directed Assembly on 1:1 and 1:n Patterns FIG. 12 is an example of a schematic illustration of processes used to create lithographically defined chemical patterns and subsequent solvent-vapor-induced directed assembly of BCP thin films. The preparation of 1:1 chemical patterns with $L_s$ approximately equals to the period of the vitrified BCP domains $L_v$ started with grafting PS—OH brush on silicon substrates. Then a layer of PMMA photoresist was applied and patterned with extreme ultraviolet interference lithography (EUV-IL). The chemical patterns were obtained by exposing the photoresist patterns to an $O_2$ plasma and stripping the remaining photoresist in chlorobenzene. The chemical patterns with $L_s$ approximately equal to $nL_v$ (n=2, 3, 4) were created on silicon substrates deposited with a thin layer of crosslinked PS (XPS) mats. A layer of PMMA photoresist was applied on the XPS mats with used EUV-IL and e-beam lithography to obtain grating patterns with $L_s \approx 2L_v$ as illustrated. (Grating patterns with $L_s \approx 3L_v$ and $4L_v$ were also obtained in this manner.) The photoresist patterns were then exposed to $O_2$ plasma for extended time to trim the pattern lines to about 0.5 $L_v$ in width and breakthrough XPS mat layer. After stripping the photoresist, $PS_{51.5\%}$-r-P2VP-r-PHEMA brush was grafted in the interspatial regions between XPS stripes for 1:2 chemical patterns. $PS_{57.0\%}$-r-P2VP-r-PHEMA brush was backfilled on 1:3 and 1:4 chemical patterns. Thin films of symmetric PS-b-P2VP ($M_n$=40.5-b-40.0 kg/mol) were spin coated on the chemical patterns.

Figure 13:
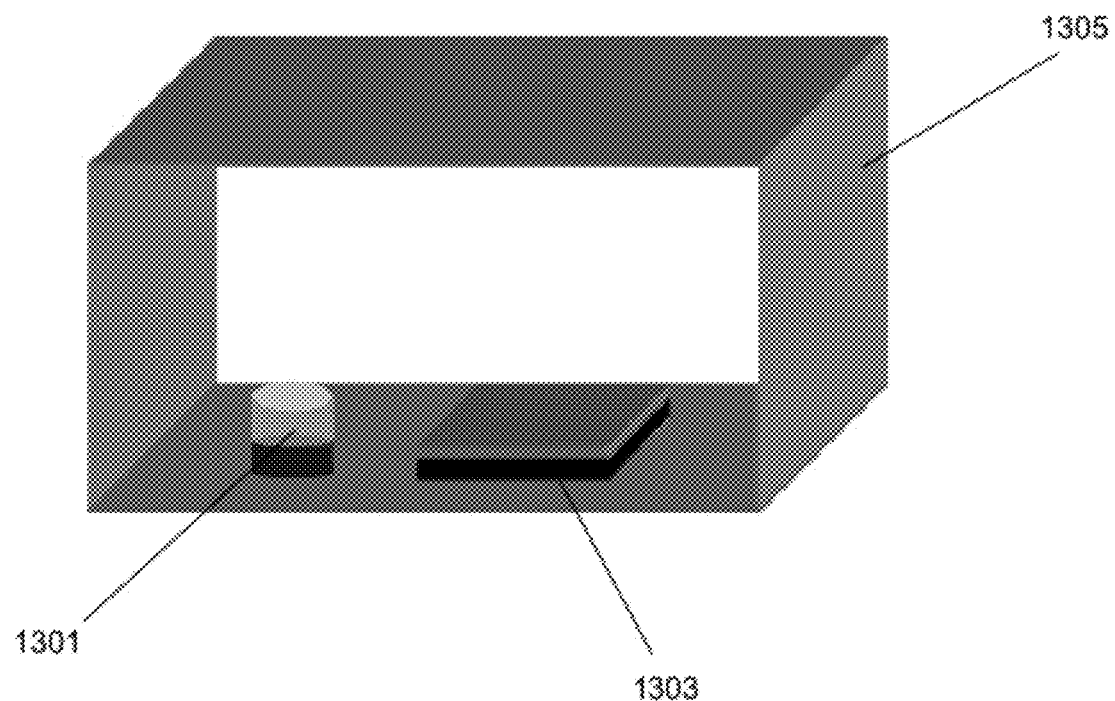
FIG. 13 shows a schematic illustration of an experimental setup for solvent annealing of BCP thin films.

The thin films were exposed to saturated acetone vapor for 14-20 h. FIG. 13 is a simplified schematic showing the experimental setup in which the BCP sample 1303 and solvent 1301 are sealed in a container 1305. Once removed from the container 1305, the absorbed solvent evaporates from the assembled BCP thin film. No significant difference was observed from samples with different annealing time in this time period.

The 30 nm thick PS-b-P2VP (40k-b-40k) films cast on chemical patterns with 40 nm≤$L_s$≤57.5 nm were annealed in acetone vapor and imaged by SEM, with the images shown in FIG. 7 and discussed above. The film assembled on $L_s$=45 nm pattern was also imaged by AFM (not shown). The smoothness of the assembled film was verified by the height image (roughness rms=0.8 nm for a 2×2 $\mu m^2$ area). The solvent annealed BCP thin films are uniform throughout the entire prepatterned area (100 by 150 $\mu m^2$). Directed assembly with high perfection is also shown in larger area images (10 $\mu m$ long). Nearly perfect assembly occurs while $L_s$ is commensurate to $L_v$.

Solvent annealing-induced two times density multiplication was demonstrated on a series of chemical patterns with 80 nm≤$L_s$≤110 nm, as discussed above with respect to FIG. 9. The uniformity of the solvent annealed films on the prepatterned area (25 by 150 $\mu m^2$, $L_s$=90 nm), and the defect-free long-range order in larger area (10 $\mu m$ long) was also observed in SEM images (not shown).

While lamellae-forming PS-b-PMMA has been directed to assemble on 1:n chemical patterns using $PS_{43-50\%}$-r-PMMA brush to backfill the interspatial region between XPS stripes, for the assembly of PS-b-P2VP via acetone annealing, a brush containing a higher styrene fraction ($PS_{51.5\%}$-r-P2VP-r-PHEMA) was used to backfill according to the higher styrene composition in the nonpreferential wetting brush ($PS_{60.8\%}$-r-P2VP-r-PHEMA) found in Example 1.

$PS_{57.0\%}$-r-P2VP-r-PHEMA brush was also used on 1:3 and 1:4 chemical patterns. Thin films of PS-b-P2VP (40k-b-40k) were spin-coated on the chemical patterns with $L_s$=138 nm ($\approx 3L_v$) and 184 nm ($\approx 4L_v$) and annealed in acetone vapor. As shown in FIG. 10, discussed above, the top-down SEM images indicate that triple and quadruple density multiplication on chemical patterns can also be induced by solvent annealing. Every third ($L_s$=138 nm) or fourth ($L_s$=184 nm) PS stripes are slightly wider than the others, which may be caused by the greater than $0.5L_0$ width of the underlying XPS stripes.

Figure 14:
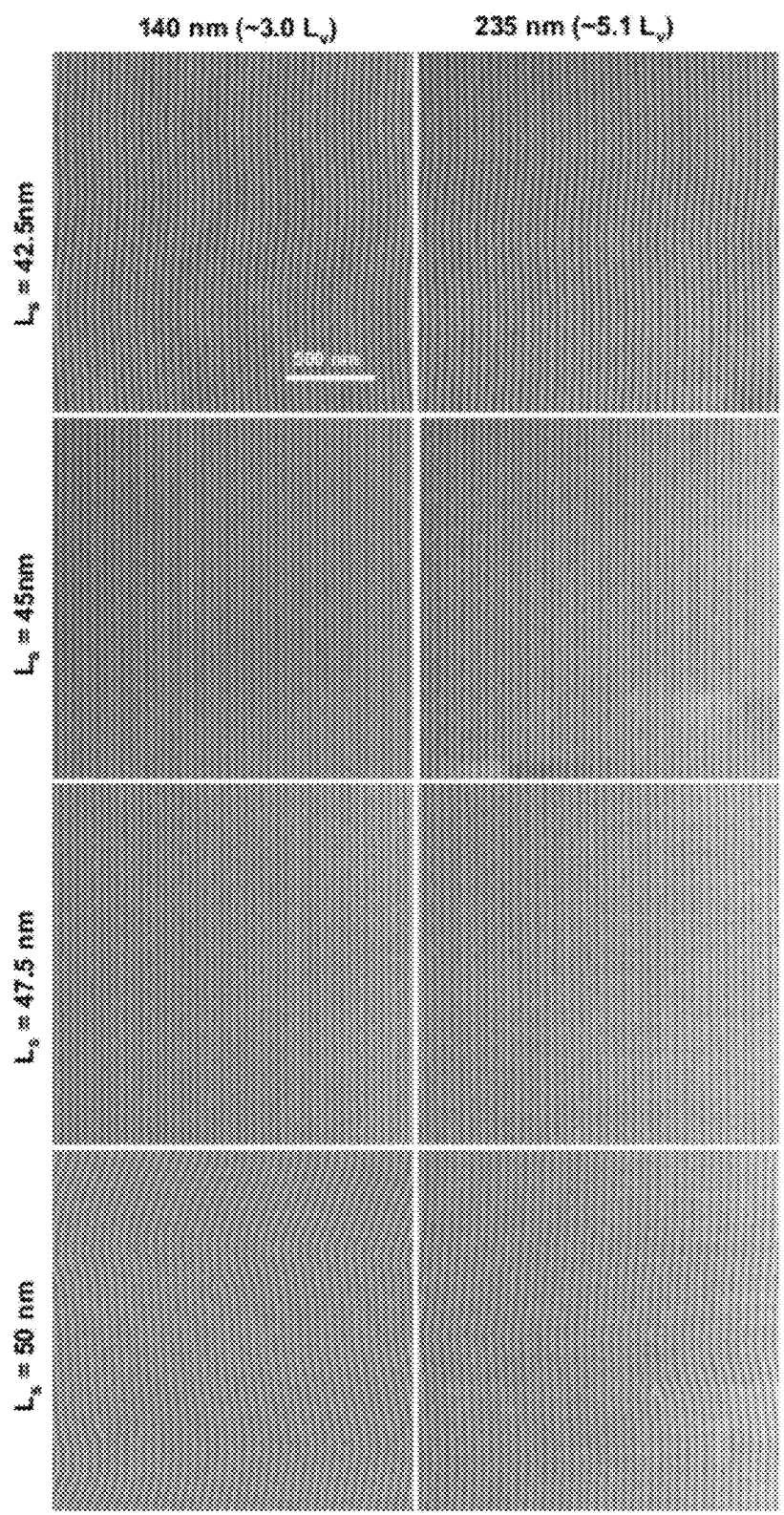
FIG. 14 shows solvent annealing induced directed assembly of relatively thick PS-b-P2VP (40k-b-40k) films on 1:1 chemical patterns with $L_s$=42.5 nm, 45 nm, 47.5 nm, and 50 nm. Top down images of assembled films of thickness 140 nm and 235 nm are shown.

Solvent vapor induced BCP assembly on 1:1 chemical patterns was also demonstrated for thick films. Upon acetone annealing, two PS-b-P2VP (40-b-40) films with thickness of 147 and 235 nm (corresponding to about $3.2L_v$ and about $5.1L_v$, respectively, with $L_v$ about 46 nm) also displayed ordered and registered structures on chemical patterns. FIG. 14 shows top down SEM images of the films for $L_s$ of 42.5, 45 nm, 47.5 and 50 nm. In comparison to the 30 nm film (FIG. 7) the commensurability tolerance decreased in the thicker films. Directed assembly with high perfection occurred only on $L_s$=45 and 47.5 nm prepatterns. On $L_s$=42.5 and 50 nm prepatterns, wavy lamellae with $L_p$ close to $L_0$ are observed. This may be due to the tilt of the lamellae to match with the wider surface pattern at the film-substrate interface. The registration of BCP patterns to the chemical patterns indicates the perpendicular orientation through the whole film thickness. This suggests that the ordering is induced by solvent evaporation at the film-substrate interface and not by (or just by) solvent evaporation at the film-air interface.

No top layer was observed in the solvent annealed PS-b-P2VP films. This is in contrast to thermal annealing, which often results in a thin top layer of PS on the PS-b-P2VP films due to the smaller surface tension of PS. It is believed that absence of the top PS layer is because the adsorbed solvent mediates the polymer-air interface energy.

One factor to achieve assembly on chemical patterns is the selective interaction between BCP blocks and the chemically patterned surface, for example, the selective wetting of PS and P2VP blocks on the PS brush and $SiO_x$ stripes respectively. During solvent annealing, the solvent to surface interaction may screen the interaction between BCP blocks and chemical patterns. The screening effect may increase with dilution of the BCP films. Therefore, the control of solvent volume fraction and the solvent selectivity may be used for the solvent annealing approach. Here, since acetone is a relatively poor solvent for PS block, relatively less acetone is absorbed in the PS domain, with the resulting interaction between the PS block and PS brush sufficient to induce directed self-assembly. The P2VP block, which contains more acetone, is flexible for the rearrangement of the BCP chains.

The results in Example 2 show that the BCP patterns register well to the chemical patterns, which suggests that the BCP assembly can be induced at the film-substrate interface by the interfacial interaction between the chemical patterns and BCP blocks. Although PS-b-P2VP has dissimilar surface tension ($\gamma_s$) between the PS and P2VP blocks, the solvent annealing approach can still produce long-range ordered perpendicularly oriented lamellae patterns that extend through the film thickness on both 1:1 and 1:n chemical patterns. The pattern quality and commensurability tolerance are comparable to those of poly(styrene-b-methyl methacrylate) (PS-b-PMMA) patterns induced by thermal annealing.

EXAMPLE 3

Directed Assembly of PS-b-PMMA Films by Solvent Annealing

Materials and Methods

Materials: PS-b-PMMA ($M_n$=52-52 and 95-92 kg/mol, polydispersity index (PDI)=1.10 and 1.06 respectively, $L_o$ 50 nm and 80 nm, respectively), hydroxyl terminated PS (PS—OH, $M_n$=6.0 kg/mol, PDI=1.07), and hydroxyl terminated PMMA (PMMA-OH, $M_n$=6.3 kg/mol, PDI=1.06) were purchased from Polymer Source Inc. PMMA photoresist ($M_n$=950 kg/mol, 4 wt % in chlorobenzene) was purchased from MicroChem Inc. All solvents were purchased from Aldrich and used as received. Hydroxyl terminated poly(styrene-r-methyl methacrylate) (PS-r-PMMA-OH, $M_n$=12.5 kg/mol, PDI=1.25) was synthesized by nitroxide-mediated polymerization. The styrene fraction was determined to be 57 mol % by $^1$H NMR analysis. Crosslinkable PS ($M_n$=30.5 kg/mol, PDI=1.22) was synthesized by nitroxide-mediated copolymerization of styrene and glycidyl methacrylate and contained about 4 mol % of crosslinkable epoxy groups.

Substrate modification: 1 wt % toluene solutions of hydroxyl terminated polymers (PS—OH, PMMA-OH, or PS-r-PMMA-OH) were spin-coated on silicon wafers and annealed at 190° C. for 7 h under vacuum. The substrates were then sonicated in toluene to remove the non-grafted polymer, which yielded 3-4 nm thick imaging layers. While preparing substrates with crosslinked PS (XPS) layer, 0.2 wt % toluene solution of crosslinkable PS was spin-coated on silicon wafers and annealed at 190° C. for 24h under vacuum. Non-crosslinked PS was removed by sonication in toluene to form a XPS layer with a thickness of about 7 nm.

Fabrication of chemical patterns: A 70-nm-thick PMMA photoresist film was deposited onto the silicon substrates grafted with PS-OH or XPS and baked at 160° C. for 60 seconds. The photoresist patterns were exposed either by electron beam lithography (EBL) or extreme ultra-violet interference lithography (EUV-IL). EBL was performed on a LEO 1550 VP SEM equipped with a J. C. Nabity pattern generation system with an acceleration voltage of 20 kV. EUV-IL was carried out at the Synchrotron Radiation Center (SRC) at the University of Wisconsin-Madison using a transmission membrane interferometric mask. All patterns were exposed on PMMA resist and developed with a 1:3 (v:v) mixture of methyl isobutyl ketone:isopropanol (MIBK:IPA) for 60 seconds and rinsed with IPA. The 1:1 chemical patterns with alternative stripes of PS—OH (or XPS) and bare $SiO_x$ were obtained by $O_2$ plasma etching and stripping the photoresist in chlorobenzene with sonication. The 1:2 chemical patterns were fabricated using resist patterns exposed on XPS-grafted substrate. The resist patterns were trimmed by extending $O_2$ plasma etching time. After removal of the photoresist with chlorobenzene, a 20-nm-thick film of PS-r-PMMA-OH with 50 mol % of styrene content was spin-coated onto the patterned substrate. The substrate was then annealed at 19° C. for 4 hrs to graft the brush into the interfacial regions between the XPS stripes. Excess PS-r-PMMA-OH was removed by sonication in toluene to yield grating patterns of alternating XPS stripes with width of ½$L_s$ and PS-r-PMMA stripes.

Solvent Annealing: Thin films of PS-b-PMMA were spin-coated on the substrates from a 1 wt % toluene solution. The samples were then placed in a sealed 20-mL vial along with an open 5-mL vial containing approximately 2 mL solvent. Solvent annealing was carried out at an ambient temperature of 22° C. for 1.5-46 hours. Identical vials and solvent containers were used for every experiment. After annealing, the samples were taken out of the vial and dried quickly in ambient atmosphere.

Scanning Electron Microscopy (SEM): A LEO 1550 VP field-emission SEM was used to image the BCP films using 1 kV acceleration voltage. The BCP films were imaged without PMMA block removal unless specified. The PMMA block was removed by exposure to UV light for 10 min, immersion into acetic acid for 2 min, and rinsing with deionized water.

Results

Ultra-thin films of PS-b-PMMA (95k-b-92k) were annealed in different solvent vapors. Micellar structures were observed from $CS_2$ vapor and disordered wormlike morphologies from chlorobenzene and toluene vapors. Acetone was chosen as the annealing solvent due to its interesting property of inducing different BCP morphologies. The polymer-solvent interaction parameters are $\chi_{PS-Acetone}$=1.1 and $\chi_{PMMA-Acetone}$=0.29.

25-nm-thick PS-b-PMMA (95k-b-92k) films on unpatterned surfaces and chemical patterns were annealed in acetone for various times between 1.5 h and 46 h. The as-cast films showed disordered wormlike structures, with top down SEM images of the annealed films shown in FIG. 4 and discussed above.

Figure 15:
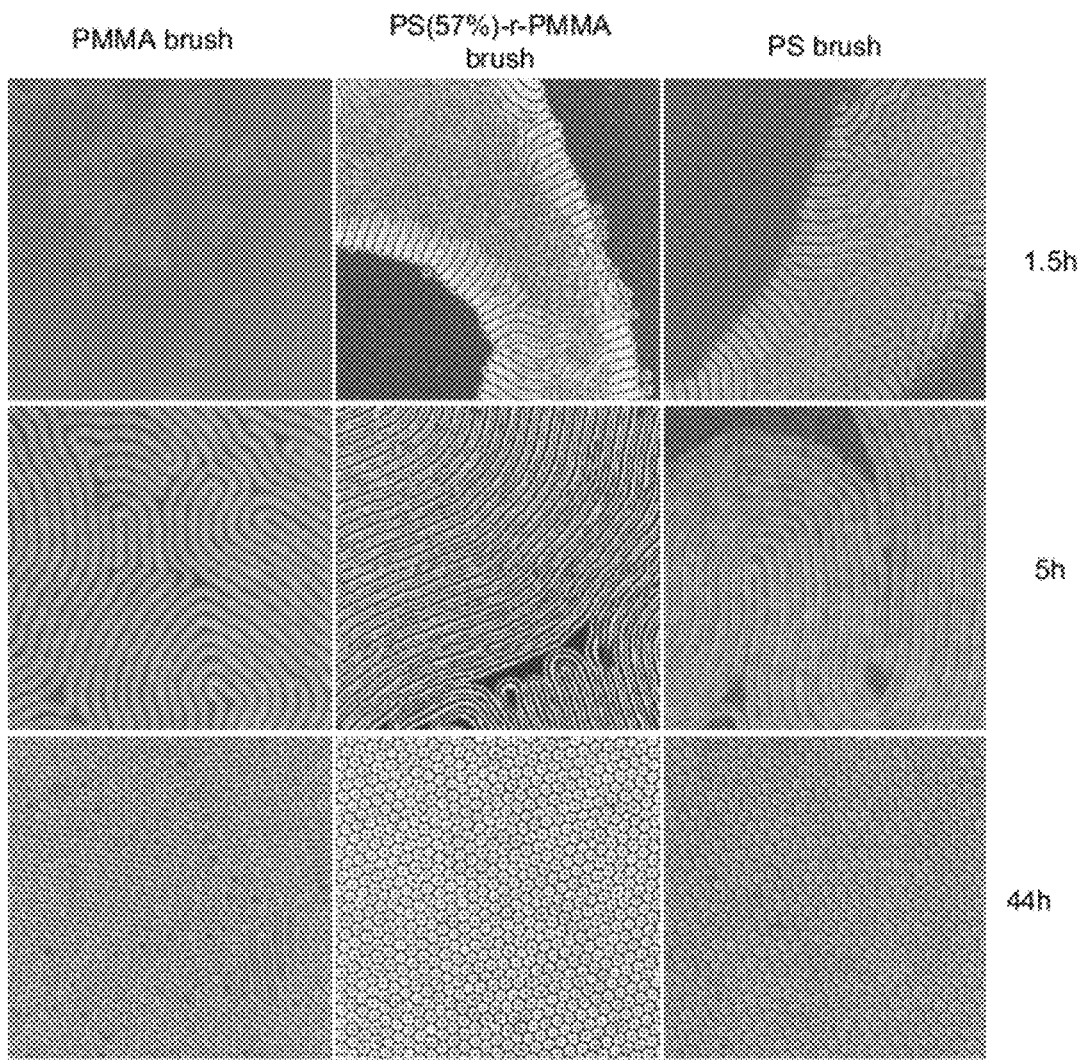
FIG. 15 shows top-down SEM images of PS-b-PMMA (95k-b-92k) films on substrates grafted by PS—OH, $PS_{57\%}$-r-PMMA-OH, and PMMA-OH. The films were annealed in acetone vapor for 1.5 h, 5 h, and 44 h.

PS-b-PMMA (95k-b-92k) films on unpatterned substrates grafted by PS—OH, $PS_{57\%}$-r-PMMA-OH, and PMMA-OH were annealed in acetone vapor for 1.5, 5, and 44 h. FIG. 15 shows top down SEM images. A similar change in morphology as is shown in FIG. 4 is observed for these surfaces.

Due to the lower surface tension of PS than that of PMMA, the as-cast films had a PS-rich layer at the top surface, verified by a 88° contact angle. The time dependent morphology transition can be explained by a mechanism involving the gradual migration of PMMA block to the top surface. Without being bound by a particular theory, it is believed that the migration may be driven by the stronger interaction between PMMA block and the solvent vapor. The BCP forms PMMA dots and stripes, with PS spheres forming as more PMMA block rises to the free surface.

Figure 16:
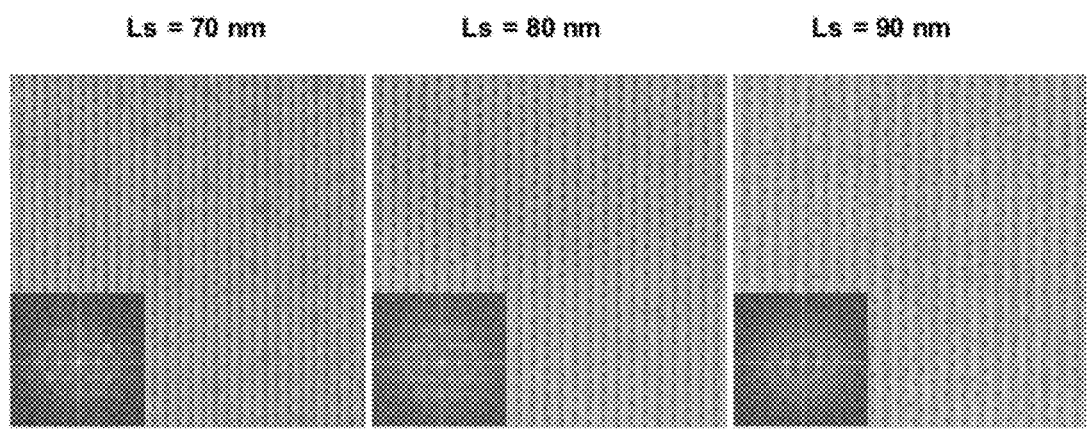
FIG. 16 shows top-down SEM images of PS-b-PMMA (95k-b-92k) films annealed in acetone vapor for 5h on chemical patterns with $L_s$=70 nm, 80 nm, and 90 nm.

FIG. 16 shows the directed assembly of PS-b-PMMA (95k-b-92k) on grating chemical patterns with $L_s$=70 nm, 80 nm, and 90 nm after 5 h acetone annealing. The SEM imaging direction was adjusted so that the stripes of chemical patterns are vertical in the images. For $L_s$=70 nm and 80 nm, commensurate with the $L_v$ of 75 nm, all PMMA dots align in the direction parallel to chemical pattern stripes. The alignment reveals the directed assembly of the chemical patterns. The PMMA dots formed pseudo hexagonal patterns as shown by the inset 2D FFT images. On chemical patterns with $L_s$=90 nm, the alignment reduced.

Figure 17:
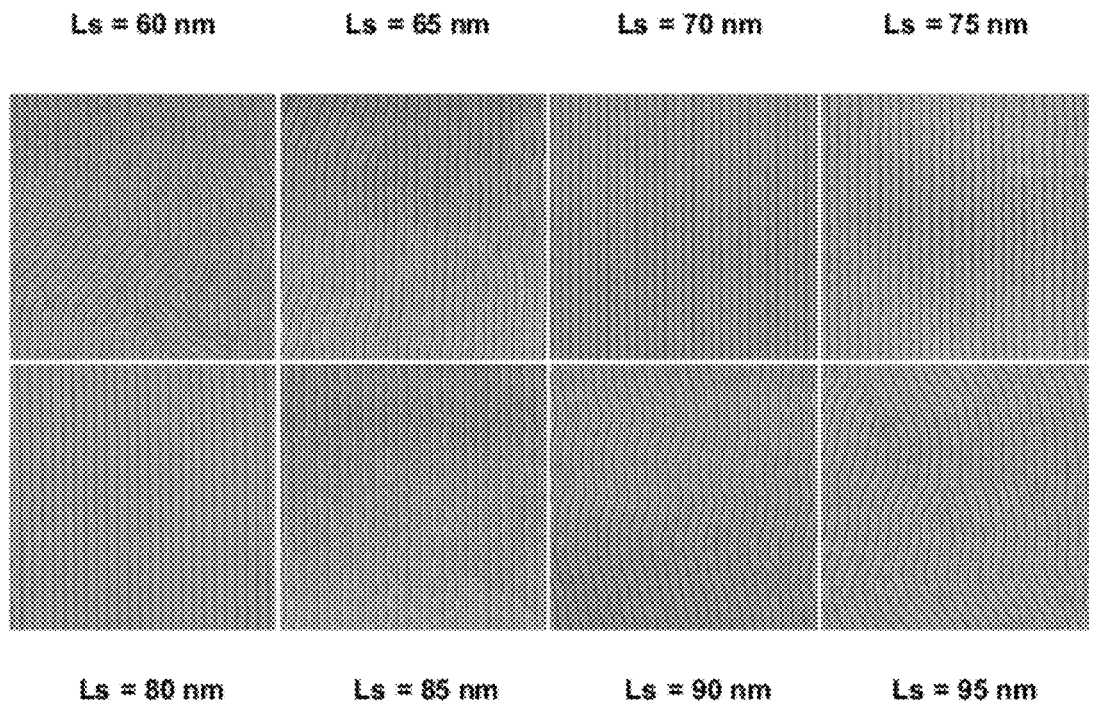
FIG. 17 shows top-down SEM images of PS-b-PMMA (95k-b-92k) films annealed in acetone vapor for 10 h on chemical patterns with $L_s$=60 nm, 65 nm, 70 nm, 75 nm, 80 nm, 85 nm, 90 nm, and 95 nm.

Stripes were observed after 10 h acetone annealing. The directed assembly of these stripes were carried out on chemical patterns with $L_s$=60 nm-95 nm, with top-down SEM images shown in FIG. 17. On chemical patterns with $L_s$=60 and 65 nm, the stripes formed patterns with period $L_p$ approximately equal to $L_v$ and which were partially oriented in the direction of the prepatterns. Long-rang ordered and registered stripes were observed on $L_s$=70 nm, 75 nm, 80 nm, and 85 nm. The periods $L_p$ of these perfect ordered stripes are consistent with the corresponding $L_s$. With increasing $L_s$ of 90 nm and 95 nm, wavy BCP stripe patterns with $L_p$ approximately equal to $L_0$ were observed.

Figure 18:
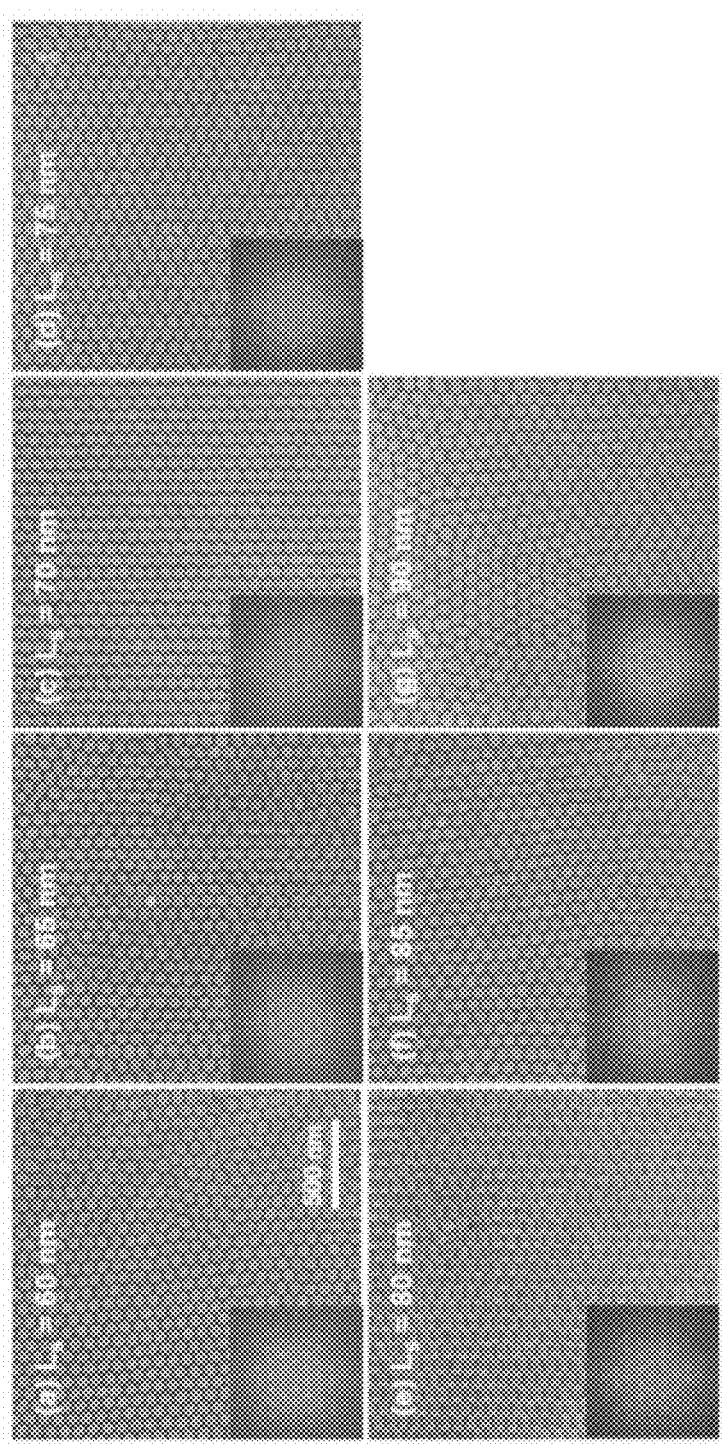
FIG. 18 shows top-down SEM images of the epitaxial assembly of PS-b-PMMA (95k-b-92k) films on grating chemical patterns with $L_s$=60 nm, 65 nm, 70 nm, 75 nm, 80 nm, 85 nm, and 90 nm after exposure to acetone vapor for 46 h.

FIG. 18 shows top-down SEM images of the epitaxial assembly of PS-b-PMMA (95k-b-92k) films on grating chemical patterns with $L_s$=60-90 nm after exposure to acetone vapor for 46 h. All films showed a honeycomb microstructure, which changed to a rounded shape after PMMA removal (not shown). These PS hexagons were closely packed. Nearly perfect long-range ordered hexagonal patterns of PS hexagons were directed by chemical patterns with $L_s$=70 nm, 75 nm, and 80 nm. The PS hexagons were nearly symmetric at $L_s$=70 nm and 75 nm, although they were smaller at $L_s$=70 nm. The hexagons stretched in the direction normal to the chemical pattern stripes at $L_s$=80 nm.

Directed assembly of PS-b-PMMA (95k-b-92k) ultrathin films on irregular chemical patterns was investigated. 25-nm-thick BCP films were directed to assemble on nested arrays of lines ($L_s$=75 nm) with 60°, 90°, 120°, and 150° bends. The results are discussed above with respect to FIG. 8.

Symmetric PS-b-PMMA ultrathin films were also directed to assemble on 1:2 chemical patterns via solvent annealing. Well-defined 1:2 chemical patterns of XPS stripes with 0.5 $L_v$ in width and backfilled with $PS_{57\%}$-r-PMMA-OH in the interspatial regions were fabricated. PS-b-PMMA (52k-b-52k) ultrathin films were annealed in acetone on the 1:2 patterns. Both PMMA dots and stripes were observed coexist after 1.5h, with 5h annealing resulting in stripe structures. The assembly took a shorter time for the smaller molecular weight BCP. The stripes of PS-b-PMMA (52k-b-52k) on PS—OH grafted silicon substrate had a vitrified BCP microdomain period, $L_v$, of 41 nm. A 80 nm chemical pattern directed nearly perfect assembly of the stripes with 2 times density multiplication. On chemical patterns with $L_s$=70 nm and 90 nm, only a small portion of the BCP stripes registered to the prepatterns. A fingerprint pattern was observed at $L_s$=100 nm.

Applications

Applications include pattern transfer as well as functionalizing one or more domains of the assembled block copolymer structure. Applications included nanolithography for semiconductor devices, fabrication of cell-based assays, nanoprinting, photovoltaic cells, and surface-conduction electron-emitter displays. In certain embodiments, patterned media and methods for fabricating pattern media are provided. The methods described herein may be used to generate the patterns of dots, lines or other patterns for patterned media. According to various embodiments, the resulting block copolymer films, nanoimprint templates, and patterned media disks are provided. In certain embodiments, a nanoimprint template is generated. A nanoimprint template is a substrate with a topographic pattern which is intended to be replicated on the surface of another substrate. There are several types of nanoimprinting processes. For UV-cure nanoimprinting, the template is a UV-transparent substrate (for example, made of quartz) with etched topographic features on one side. The patterned side of the template is brought into contact with a thin film of UV-curable liquid nanoimprint resist on the substrate to which the pattern is intended to be transferred. The liquid conforms to the topographic features on the template, and after a brief UV exposure, the liquid is cured to become a solid. After curing, the template is removed, leaving the solid resist with the replicated inverse topographic features on the second substrate. Thermal nanoimprinting is similar, except that instead of UV-light curing a liquid resist, heat is used to temporarily melt a solid resist to allow flow of the resist to conform with topographic features on the template; alternatively, heat can be used to cure a liquid resist to change it to a solid. For both approaches, the solid resist pattern is then used in subsequent pattern transfer steps to transfer the pattern to the substrate (or the resist may be used directly as a functional surface itself). The nanoimprint template may be generated by selectively removing one phase of the block copolymer pattern and replicating the topography of the remaining polymer material with a molding or nanoimprinting process. In certain embodiments, the nanoimprint template may be generated with one or more additional pattern transfer operations. A discussion of using an assembled BCP film to generate a nanoimprint template for patterned media applications is discussed, for example, in above-referenced US 2009-0196488, titled "Density Multiplication And Improved Lithography By Directed Block Copolymer Assembly."

Figure 19:
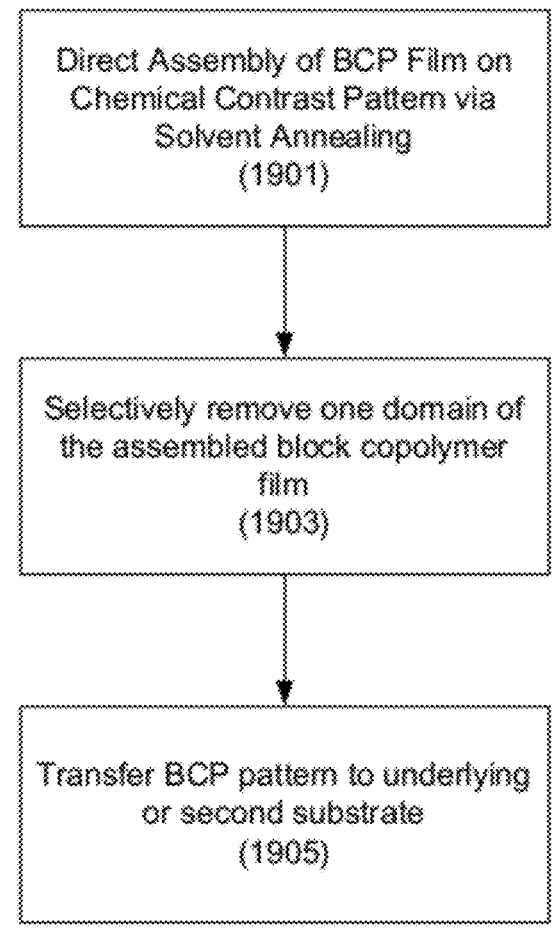
FIG. 19 is a process flow diagram illustrating operations in creating and using a BCP thin film composition.

FIG. 19 is a process flow diagram illustrating operations in creating and using a BCP according to certain embodiments. First, a block copolymer film is directed to assemble on substrate with a chemical contrast pattern via solvent annealing (1901). This is done in accordance with the methods described above. One of the domains of the block copolymer film is then removed, e.g., by an oxygen plasma, thereby creating raised or recessed features (1903). The topographic pattern is then transferred to a substrate (1905). According to various embodiments, the pattern may be transferred by using the remaining polymer material as an etch mask for creating topography in the underlying substrate, or by replicating the topography in a second substrate, for example, by using a molding or nanoimprinting process.

The resulting structure can then be replicated by nanoimprinting, for example to create patterned media. The flow diagram shown in FIG. 19 is just an example of a process. In certain embodiments, the structure created by selective removal of one of the polymer phases in 1903 may be used as a template, e.g., after treating or functionalizing the remaining phase.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

The invention claimed is:

1. A method comprising:
   providing a substrate pattern;
   depositing a block copolymer material on the substrate pattern; and inducing the formation of microphase-separated domains in the block copolymer material by solvent annealing, wherein the substrate pattern has a pattern period ($L_s$) between 0.8 and 1.2 times a vitrified microdomain period of the block copolymer material in the solvent ($L_v$).

2. The method of claim 1, wherein $L_v$ is not equal to the bulk period $L_o$ of the block copolymer material.

3. The method of claim 1, wherein $L_v$ is less than the bulk period $L_o$ of the block copolymer material.

4. The method of claim 1, wherein $L_v$ is greater than the bulk period $L_o$ of the block copolymer material.

5. The method of claim 1, wherein the substrate pattern includes at least one feature having an effective pattern period that differs from $L_s$.

6. The method of claim 1, further comprising evaporating the solvent.

7. The method of claim 1, further comprising, prior to providing the substrate pattern, determining $L_v$.

8. The method of claim 1, wherein the solvent is selected from methanol, acetone, carbon disulfide, dimethylformamide, toluene, and tetrahydrofuran.

9. The method of claim 1, wherein all of the polymer blocks of the block copolymer material are soluble in the solvent.

10. The method of claim 1, wherein at least one of the polymer blocks of the block copolymer material is insoluble in the solvent.

11. The method of claim 1, wherein the microphase-separated domains are registered with the substrate pattern.

12. The method of claim 1, wherein the microphase-separated domains are oriented substantially perpendicular to the substrate.

13. The method of claim 12, wherein the microphase-separated domains extend through the entire thickness of the block copolymer material.

14. The method of claim 1, wherein $L_s$ is between 0.9 $L_v$ and 1.1$L_v$.

15. The method of claim 1, wherein the interaction parameter ($\chi$) of a block copolymer in the block copolymer material is larger than that of PS-b-PMMA at the temperature of assembly.

16. The method of claim 1, wherein the solvent annealing is performed at room temperature.

17. A method comprising:
providing a block copolymer film on a substrate pattern;
exposing the block copolymer film on the substrate pattern to a solvent to thereby direct the assembly of the block copolymer film while the block copolymer film is in a solvated and microphase-separated state such that the block copolymer film has assembled domains having dimensions in x- and y-directions, the x- and y-directions being parallel to an underlying substrate; and,
after directing the assembly of the block copolymer film, evaporating the solvent such that the assembled domains are in a vitrified state, wherein the x- and y-dimensions of the assembled domains in the vitrified state are the same as the x- and y- dimensions of the assembled domains in the solvated state.

18. The method of claim 17, wherein the assembled block copolymer film has smaller features than the bulk block copolymer.

19. The method of claim 17, wherein the density of features in the assembled block copolymer film is greater than the substrate pattern density.

* * * * *